United States Patent
Huang et al.

(10) Patent No.: US 11,676,943 B2
(45) Date of Patent: Jun. 13, 2023

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Chien-Yuan Huang, Hsinchu (TW); Shih-Chang Ku, Taipei (TW); Tsung-Shu Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 123 days.

(21) Appl. No.: 17/238,218

(22) Filed: Apr. 23, 2021

(65) Prior Publication Data
US 2022/0344305 A1   Oct. 27, 2022

(51) Int. Cl.
| | |
|---|---|
| H01L 23/48 | (2006.01) |
| H01L 23/52 | (2006.01) |
| H01L 29/40 | (2006.01) |
| H01L 25/065 | (2023.01) |
| H01L 23/00 | (2006.01) |
| H01L 25/00 | (2006.01) |

(52) U.S. Cl.
CPC ........ *H01L 25/0657* (2013.01); *H01L 23/481* (2013.01); *H01L 23/562* (2013.01); *H01L 24/08* (2013.01); *H01L 24/80* (2013.01); *H01L 25/50* (2013.01); *H01L 2224/08145* (2013.01); *H01L 2224/80895* (2013.01); *H01L 2224/80896* (2013.01); *H01L 2225/06548* (2013.01); *H01L 2225/06589* (2013.01); *H01L 2924/3511* (2013.01)

(58) Field of Classification Search
CPC combination set(s) only.
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |

(Continued)

*Primary Examiner* — Niki H Nguyen
(74) *Attorney, Agent, or Firm* — JCIPRNET

(57) ABSTRACT

A semiconductor structure includes a first die, second dies coupled to and on the first die, a dielectric layer on the first die and covering each second die, and through dielectric vias (TDVs) coupled to and on the first die. The first die includes a bonding dielectric layer and bonding features embedded in and leveled with the bonding dielectric layer. An array of second dies is arranged in a first region of the first die. Each second die includes a bonding dielectric layer and a bonding feature embedded in and leveled with the bonding dielectric layer. The bonding dielectric layer and the bonding feature of each second die are respectively bonded to those of the first die. The TDVs are laterally covered by the dielectric layer in a second region of the first die which is connected to the first region and arranged along a periphery of the first die.

20 Claims, 16 Drawing Sheets

(56) References Cited

U.S. PATENT DOCUMENTS 9,735,131 B2 8/2017 Su et al.
10,504,852 B1 * 12/2019 Chen .................. H01L 25/0657
10,504,873 B1 * 12/2019 Chen .................. H01L 23/5226

* cited by examiner

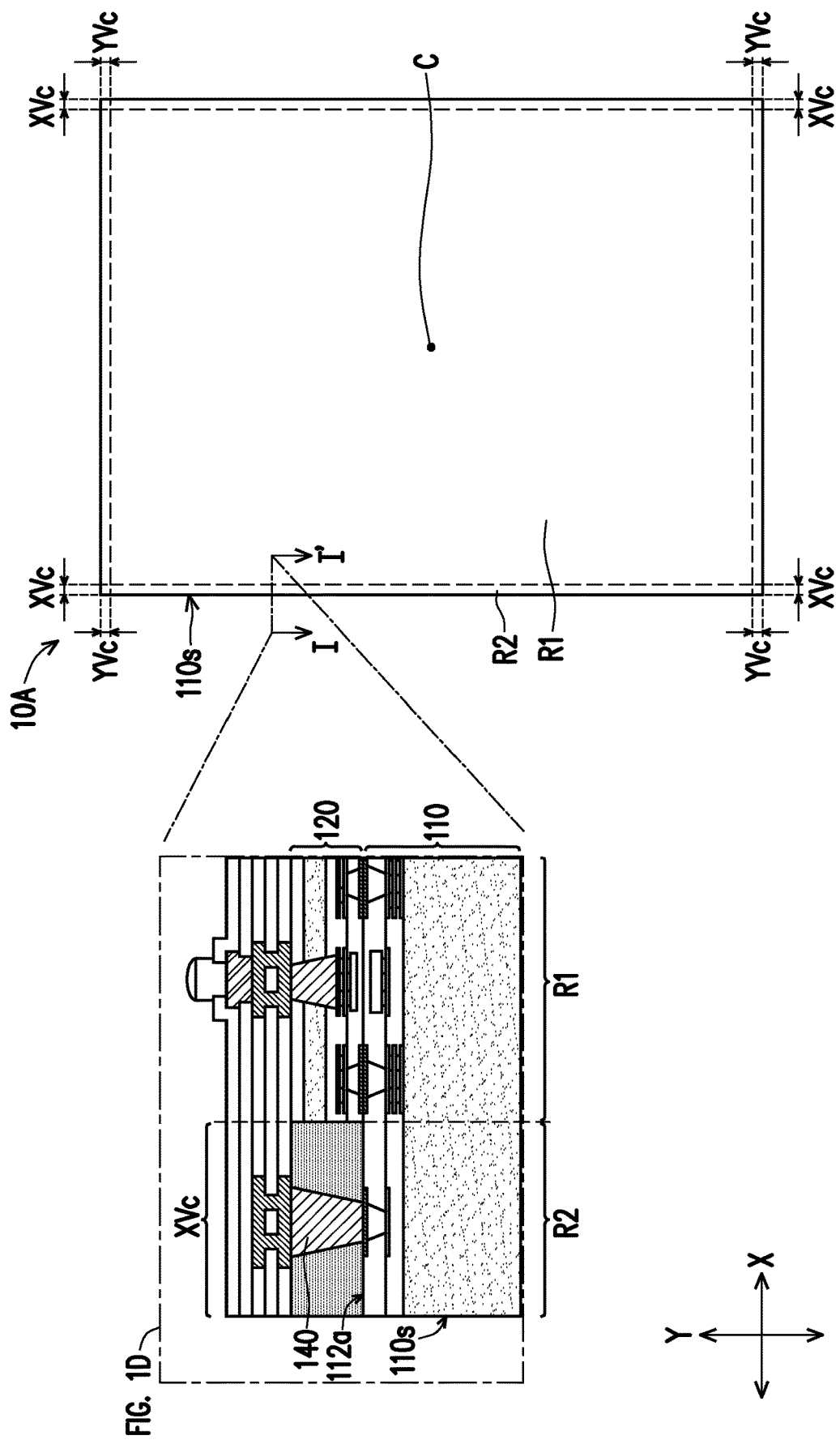

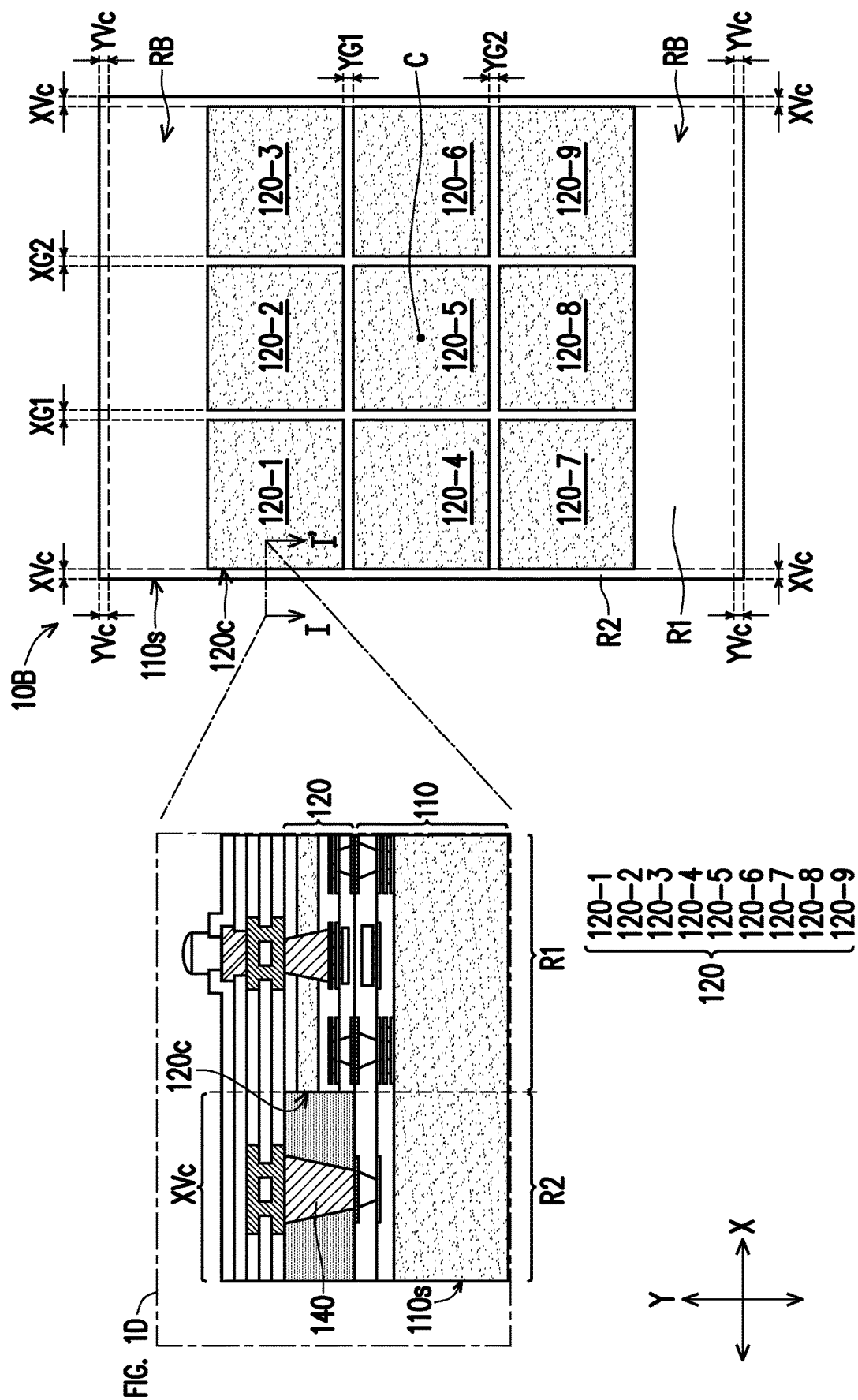

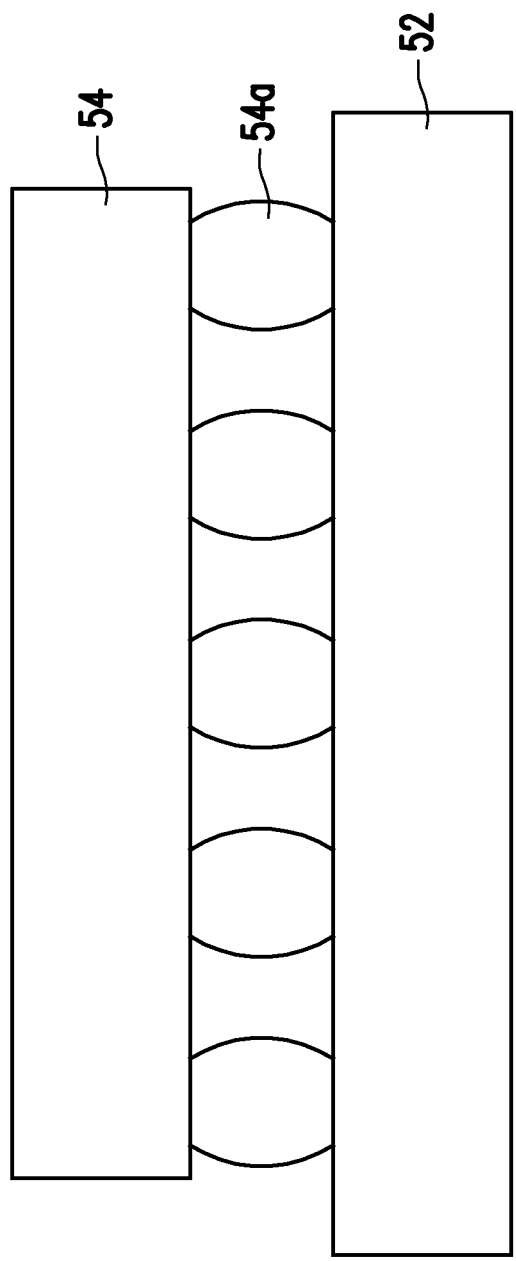

SEMICONDUCTOR STRUCTURE AND MANUFACTURING METHOD THEREOF

BACKGROUND

The semiconductor industry has experienced rapid growth due to continuous improvement in integration density of various components, e.g., transistors, diodes, resistors, capacitors, etc. For the most part, this improvement in integration density has come from successive reductions in minimum feature size, which allows more components to be integrated into a given area. Technological advances in integrated circuit (IC) design have produced generations of ICs where each generation has smaller and more complex circuit designs than the previous generation. There is continuous effort in developing new mechanisms of forming semiconductor structures having improved electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are schematic top-down views showing a first type configuration of a semiconductor structure according to some embodiments.

FIG. 6 is a schematic cross-sectional view showing an application of a semiconductor structure according to some embodiments.

DETAILED DESCRIPTION

Figure 1A:
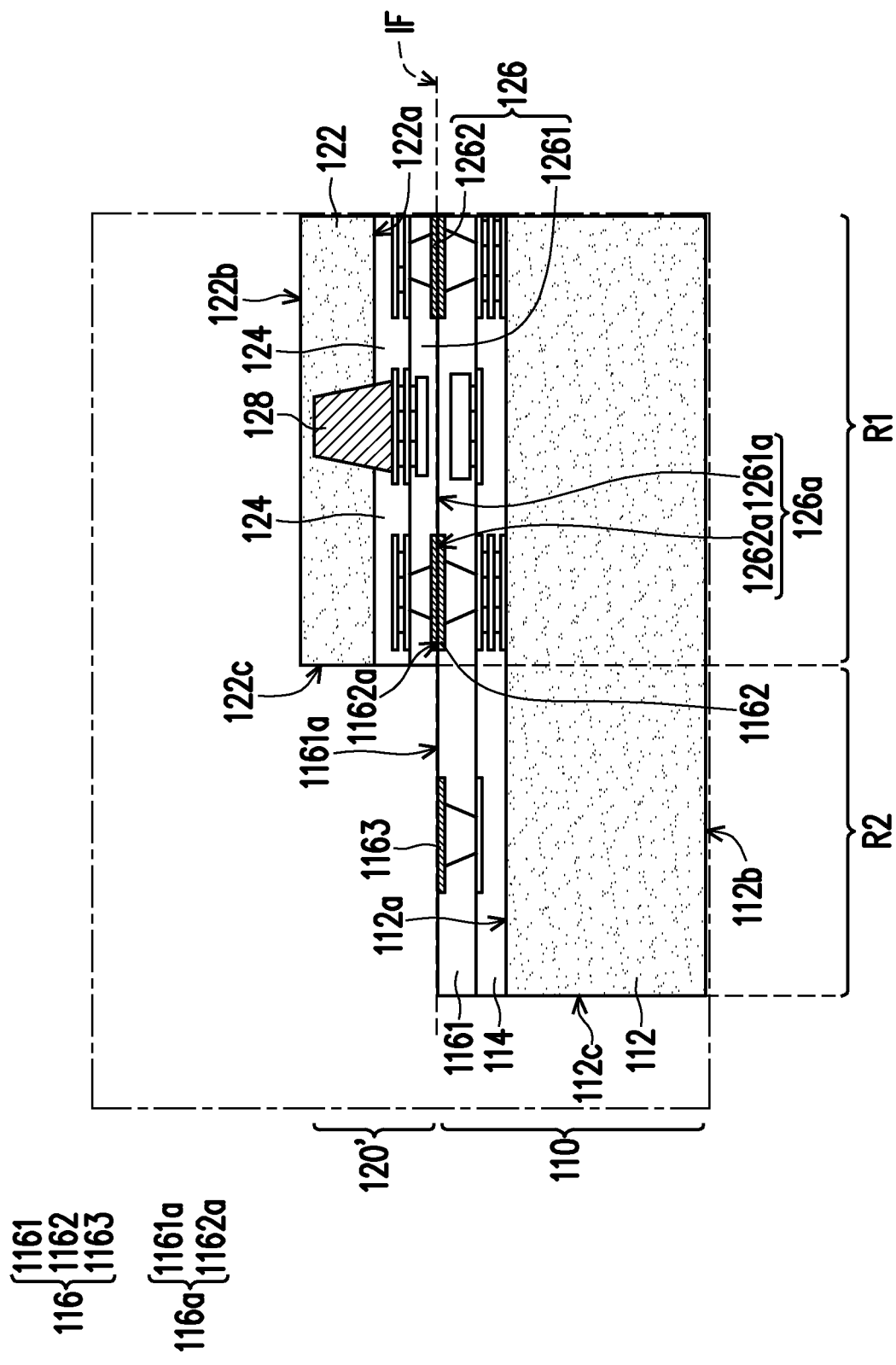
FIGS. 1A-1D are schematic and partial cross-sectional views showing various stages in a manufacturing method of a semiconductor structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1D are schematic and partial cross-sectional views showing various stages in a manufacturing method of a semiconductor structure according to some embodiments. Referring to FIG. 1A, at least one second die 120' is bonded to a first die 110. Although only one second die 120' is shown, it should be appreciated that a plurality of second dies 120' may be bonded to the first die 110 as will be described later in accompanying with various top-down views. The size (e.g., the top-view size or the cross-sectional size) of the first die 110 may be greater than that of the respective second die 120'. The first die 110 may be viewed as a carrier die for carrying multiple second dies and other elements thereon. The first die 110 may include a first region R1 and a second region R2 surrounding the first region R1. For example, the first region R1 is a die-bonding region and the second region R2 is a through dielectric via (TDV) region. In some embodiments, the first region R1 is position at the center, while the second region R2 is position at the periphery. Although other configuration may be possible.

In some embodiments, the first die 110 includes a first semiconductor substrate 112, which may include a semiconductor material such as silicon, doped or undoped, or an active layer of a semiconductor-on-insulator (SOI) substrate. The first semiconductor substrate 112 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may be used. The first semiconductor substrate 112 may include an active surface 112a, a rear surface 112b opposite to the active surface 112a, and a sidewall 112c connected to the active surface 112a and the rear surface 112b. A plurality of semiconductor devices (not shown; such as active devices (e.g., transistors, diodes, etc.) and/or passive devices (e.g., capacitors, resistors, inductors, etc.)) may be formed on the active surface 112a of the first semiconductor substrate 112.

The first die 110 may include a first interconnect structure 114 formed over the active surface 112a of the first semiconductor substrate 112 and electrically coupled to the semiconductor devices. For example, the first interconnect structure 114 include one or more dielectric layer(s) and metallization pattern(s) embedded in the dielectric layers. The metallization pattern may route electrical signals between the semiconductor devices by using conductive vias and lines, and the semiconductor devices and the metallization patterns may be interconnected to perform one or more functions including memory structures, processing structures, sensors, amplifiers, power distribution, input/output circuitry, or the like. For example, the first die 110 may include logic circuits, processing circuits, control circuits, I/O circuits, memory circuits, bias circuits, testing circuits, reference circuits, and/or the like. The dielectric layers of the first interconnect structure 114 may be formed of an oxide, a nitride, an oxynitride, compounds thereof, composites thereof, combinations thereof, and/or the like. The material of the metallization patterns may be or may include tungsten, cobalt, nickel, copper, silver, gold, aluminum, the like, or combinations thereof.

The first die 110 may include a first bonding structure 116 formed over the first interconnect structure 114. For example, the first bonding structure 116 includes a first bonding dielectric layer 1161, a plurality of first bonding features 1162 and landing features (e.g., pads) 1163 embedded in the first bonding dielectric layer 1161. The first bonding features 1162 and the landing features 1163 may be electrically coupled to the semiconductor devices through the metallization patterns of the first interconnect structure 114, where the first bonding features 1162 may be distributed within the first region R1 and the landing features 1163 may be distributed within the second region R2. A material of the first bonding dielectric layer 1161 may be or may include silicon oxide (e.g., TEOS formed oxide), silicon nitride, silicon oxynitride, and/or the like. The first bonding features 1162 and the landing features 1163 may be formed of a metal such as copper, a copper alloy, or other suitable conductive material(s). In some embodiments, the top surfaces 1162a of the first bonding features 1162 are substantially leveled (e.g., coplanar) with a top surface 1161a of the first bonding dielectric layer 1161. In some embodiments, the top surface of the first bonding structure 116 may be viewed as a first bonding surface 116a and may be substantially flat for the subsequent die-bonding process. It is appreciated that the aforementioned examples are provided for illustrative purposes, and other elements may be used as appropriate for a given application.

With continued reference to FIG. 1A, the second die 120' may be formed in a semiconductor wafer (not shown), which may include different die regions that are singulated to form a plurality of second dies 120'. The second die 120' may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The second die 120' may perform the same function as (or a different function than) the first die 110.

The second die 120' may include a second semiconductor substrate 122 having an active surface 122a, a rear surface 122b opposite to the active surface 122a, and a sidewall 122c connected to the active surface 122a and the rear surface 122b. For example, the second semiconductor substrate 122 is made of the material same as or similar to the candidate material of the first semiconductor substrate 112. The second die 120' may include semiconductor devices (e.g., transistors, diodes, capacitors, resistors, inductors, and/or the like) which may be formed on the active surface 122a of the second semiconductor substrate 122. The second die 120' may include a second interconnect structure 124 formed over the active surface 122a of the second semiconductor substrate 122. For example, the second interconnect structure 124 includes one or more dielectric layer(s) and metallization patterns embedded in the dielectric layer, where the metallization patterns may be electrically coupled to the semiconductor devices and may be viewed as an interconnecting circuitry of the second die 120'. The materials of the dielectric layers and the metallization patterns of the second interconnect structure 124 may be the same as or similar to those of the dielectric layers and the metallization patterns of the first interconnect structure 114 of the first die.

The second die 120' may include a second bonding structure 126 formed over the second interconnect structure 124. For example, the second bonding structure 126 includes a second bonding dielectric layer 1261 and a plurality of second bonding features 1262 embedded in the second bonding dielectric layer 1261. The materials of the second bonding dielectric layer 1261 and the second bonding features 1262 may be respectively similar to those of the first bonding dielectric layer 1161 and the first bonding features 1162. The second bonding features 1262 may be electrically coupled to the semiconductor devices at the active surface 122a through the metallization patterns of the second interconnect structure 124. In some embodiments, top surfaces 1262a of the second bonding features 1262 are substantially leveled (e.g., coplanar) with a top surface 1261a of the second bonding dielectric layer 1261. The top surfaces 1262a of the second bonding features 1262 and the top surface 1261a of the second bonding dielectric layer 1261 may be viewed as a second bonding surface 126a of the second bonding structure 126 and may be substantially flat for the subsequent die-bonding process.

With continued reference to FIG. 1A, the second die 120' may include at least one through substrate via (TSV) 128 formed to connect the metallization patterns of the second interconnect structure 124 and extending into the second semiconductor substrate 122 from the active surface 122a of the second semiconductor substrate 122. The TSV 128 may include a conductive material with a barrier layer interposed between the conductive material and the second semiconductor substrate 122. Examples of the conductive material of the TSV 128 include copper, tungsten, aluminum, silver, gold, a combination thereof, and/or the like, and examples of the material of the barrier layer of the TSV 128 include an oxide, a nitride, or an oxynitride, a combination thereof, and/or the like. In some embodiments, the TSV 128 is buried in the second semiconductor substrate 122 and does not extend to the rear surface 122b of the second semiconductor substrate 122 at this stage.

Still referring to FIG. 1A, the second die 120' and the first die 110 may be separately fabricated, and then the second die 120' may be positioned within the first region R1 of the first die 110. Next, a bonding process may be performed on the second die 120' and the first die 110. In some embodiments, the second die 120' and the first die 110 are physically coupled in a face-to-face manner. In some embodiments, the second die 120' and the first die 110 are bonded through a hybrid bonding process. The bonding process may include dielectric-to-dielectric bonding (e.g., oxide-to-oxide bonding), metal-to-metal bonding (e.g., copper-to-copper bonding), metal-to-dielectric bonding (e.g., copper-to-oxide bonding), any combinations thereof, and/or the like. For example, the second bonding structure 126 of the second die 120' is directly connected to the first bonding structure 116 of the first die 110, where at the bonding interface IF, the second bonding dielectric layer 1261 is bonded to the first bonding dielectric layer 1161, and the second bonding features 1262 are bonded to the first bonding features 1162. It should be noted that pad-to-pad bonding illustrated herein is merely an example, and via-to-via bonding or via-to-pad bonding may be employed in accordance with some embodiments.

In some embodiments, to facilitate hybrid bonding, surface preparation for bonding surfaces (e.g., the bonding surface 116a of the first die 110 and the bonding surface 126a of the second die 120') is performed to remove particles thereon. The surface preparation may include surface cleaning and activation or other suitable process. In some embodiments, the top surfaces 1162a of the first bonding features 1162 and the top surfaces 1262a of the second bonding features 1262 may be cleaned by wet cleaning before performing the bonding. For example, not only particles are removed, but also native oxide formed on the top surfaces 1162a of the first bonding features 1162 and the top surfaces 1262a of the second bonding features 1262 are removed by chemicals used in the wet cleaning. After cleaning, activation of the top surface 1261a of the second bonding dielectric layer 1261 and at least a portion of the top surface 1161a of the first bonding dielectric layer 1161 corresponding to the first region R1 may be performed for development of high bonding strength. For example, plasma activation is performed to treat the top surface 1261a of the second bonding dielectric layer 1261 and the top surface 1161a of the first bonding dielectric layer 1161.

In some embodiments, the second die 120' is aligned with the first die 110 and sub-micron alignment precision may be achieved. For example, each bonding feature 1262 of the second die 120' may be substantially aligned with the corresponding first bonding feature 1162 in the first region R1 of the first die 110. Once the second die 120' and the first die 110 are aligned precisely, the second die 120' and the first die 110 may be placed on and in contact with one another. When the activated top surface 1261a of the second bonding dielectric layer 1261 is in contact with the activated top surface 1161a of the first bonding dielectric layer 1161, the second bonding dielectric layer 1261 of the second die 120' and the first bonding dielectric layer 1161 of the first die 110 may be pre-bonded. For example, the second die 120' and the first die 110 are pre-bonded through the pre-bonding of the first bonding dielectric layer 1161 and the second bonding dielectric layer 1261. After pre-bonding, the second bonding features 1262 may respectively correspond to and may be in physical contact with the first bonding features 1162.

In some embodiments, after pre-bonding, a treatment for dielectric bonding to strengthen the bonding between the first bonding dielectric layer 1161 and the second bonding dielectric layer 1261 is performed. In some embodiments, a thermal annealing is performed to facilitate the bonding between the second bonding features 1262 of the second die 120' and the first bonding features 1162 of the first die 110. In some embodiments, the process temperature of the thermal annealing for bonding features' bonding is higher than that of the treatment for dielectric bonding at the bonding interface IF. Since the thermal annealing performing onto the second bonding features 1262 of the second die 120' and the first bonding features 1162 of the first die 110 is performed at relative higher temperature, metal diffusion and grain growth may occur at the bonding interface IF between the second bonding features 1262 of the second die 120' and the first bonding features 1162 of the first die 110. After the bonding is complete, the second bonding features 1262 and the first bonding features 1162 form metal-to-metal bonds which provide vertical electrical connections between the second die 120' and the first die 110. The landing features 1163 in the second region R2 of the first die 110 may remain exposed after the bonding.

Figure 1B:
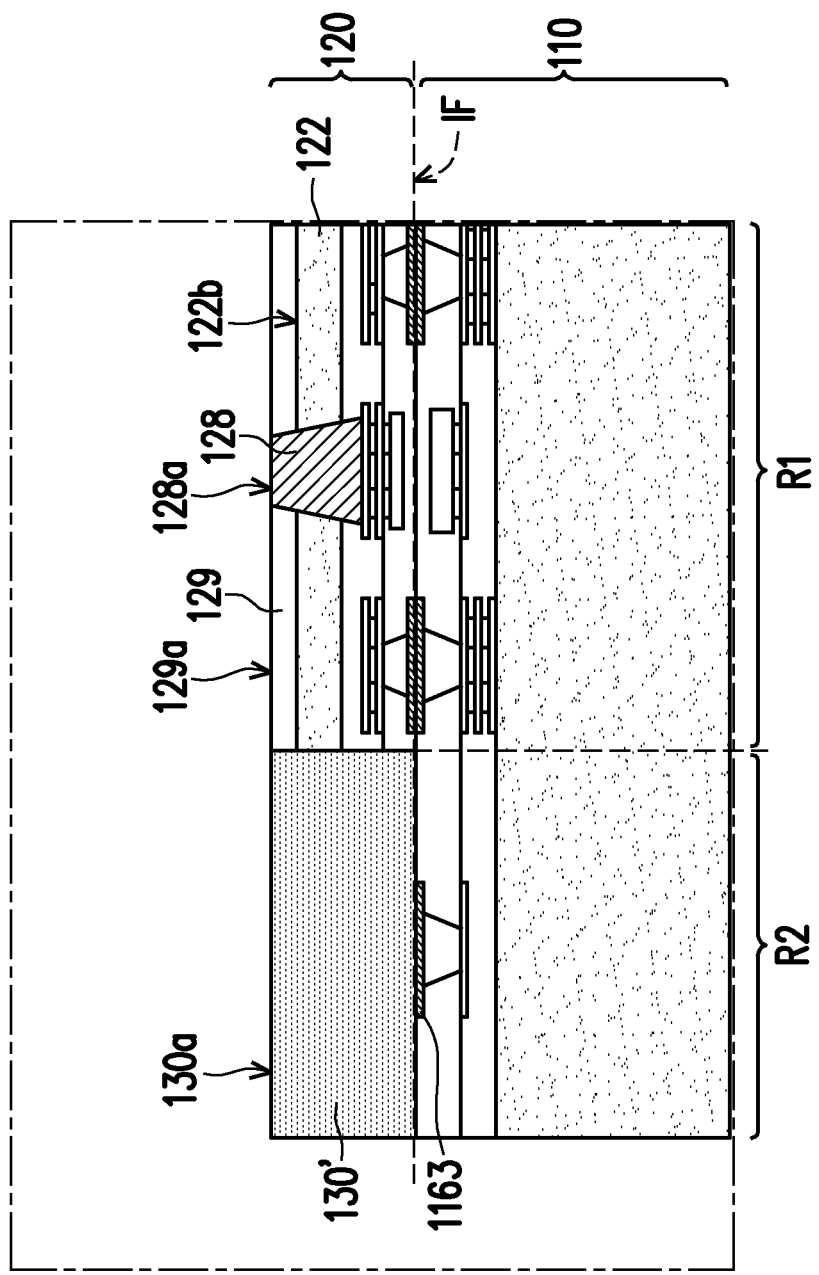

Referring to FIG. 1B and also with reference to FIG. 1A, a dielectric material layer 130' is formed on the first die 110. In some embodiments, a plurality of the second dies 120' are disposed side by side as an array in the first region R1 of the first die 110, and a gap may be formed between neighboring second dies 120'. The dielectric material layer 130' may be formed in the gap between the neighboring second dies 120' and may be referred to as "gap fill oxide". The dielectric material layer 130' may also be formed on the second region R2 of the first die 110. For example, the dielectric material layer 130' may be in physical contact with the top surface 1163a of the landing features 1163 and the top surface 1161a of the first bonding dielectric layer 1161 in the second region R2. The dielectric material layer 130' may be or may include silicon oxide, silicon nitride, tetraethoxysilane (TEOS), and/or the like, and may be formed through chemical vapor deposition (CVD), plasma-enhanced CVD (PECVD), or other suitable deposition process. Alternatively, the dielectric material layer includes polymer, a molding compound, a resin, or other suitable insulating material that may provide a degree of protection for the second dies.

With continued reference to FIG. 1B, the second semiconductor substrate 122 may be thinned to form the second die 120. For example, a planarization process (e.g., chemical-mechanical polishing (CMP), grinding, etching, a combination thereof, etc.) may be performed to form the dielectric material layer 130' and the second die 120, respectively. For example, after the planarization, the TSV 128 extends through the second semiconductor substrate 122 and may be accessibly revealed at the rear surface 122b of the second semiconductor substrate 122. In some embodiments, the second semiconductor substrate 122 is slightly etched, so that a portion of the TSV 128 may be protruded from the rear surface 122b. In some embodiments, an isolating liner 129 is formed on the rear surface 122b of the second semiconductor substrate 122 to laterally cover the portion of the TSV 128 that is protruded from the rear surface 122b. The material of the isolating liner 129 may be or may include silicon nitride, silicon oxide, silicon oxynitride, silicon carbide, a polymer, the like, etc. In some embodiments, the top surface 130a of the dielectric material layer 130' may be substantially leveled (e.g., coplanar) with the top surface 129a of the isolating liner 129 and the exposed surface 128a of the TSV 128.

Figure 1C:
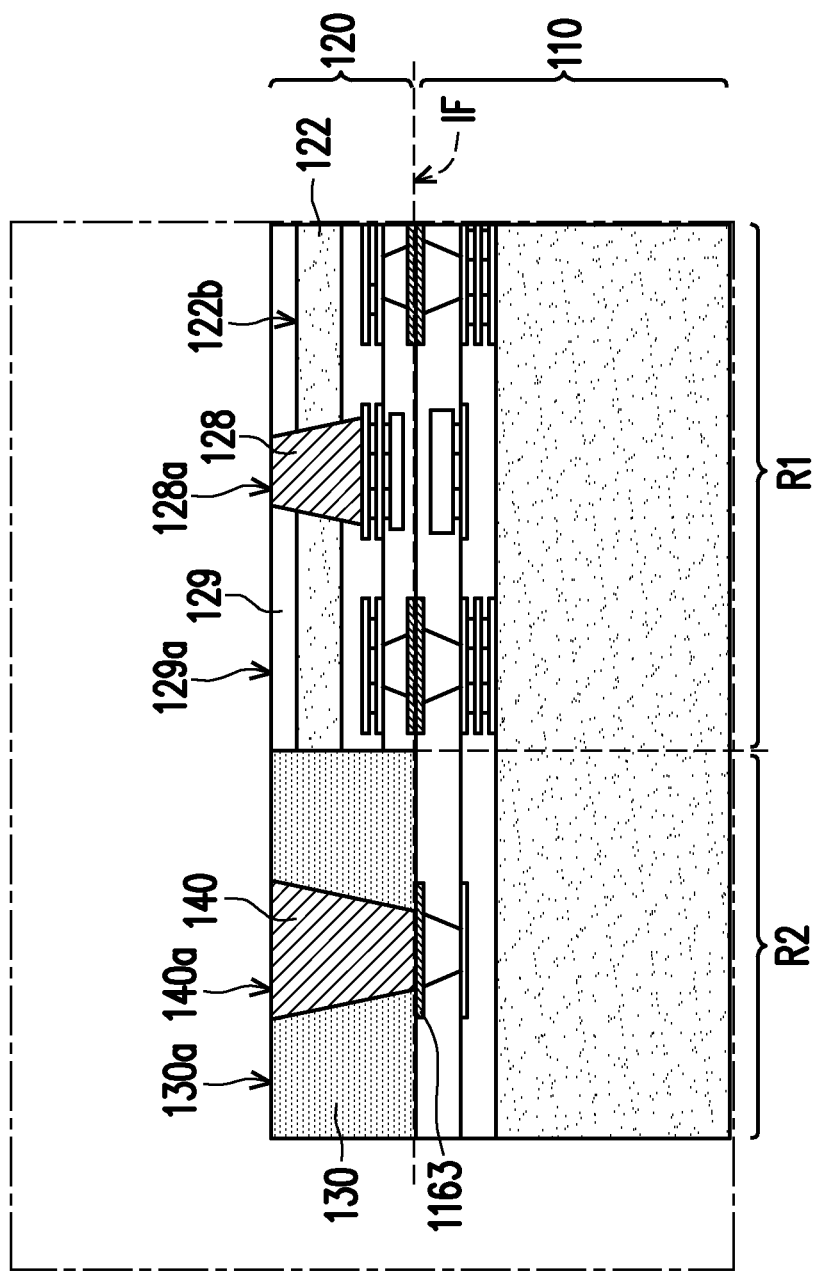

Referring to FIG. 1C and with reference to FIG. 1B, a portion of the dielectric material layer 130' in the second region R2 may be removed to form the a dielectric layer 130 with at least one via hole, and at least one through dielectric via (TDV) 140 may be formed in the via hole of the dielectric layer 130 to be in physical and electrical contact with the landing feature 1163 of the first die 110. It should be appreciated that although a single landing feature and a single TDV are illustrated, more than one landing features and the corresponding TDVs may be provided depending on product requirements. In some embodiments, the TDVs 140 and the TSVs 128 are tapered toward the opposing directions, where the TSVs 128 are tapered along a direction from the bonding interface IF to the top surface 129a of the isolating liner 129, and the TDVs 140 are tapered along a direction from the top surface 130a of the dielectric layer 130 to the bonding interface IF. Alternatively, the TSVs and the TDVs are formed at the same step and may be tapered in the same direction. In other embodiments, the TDVs and/or the TSVs have substantially vertical sidewalls. In some embodiments, the planarization process is performed to level the TDVs 140, the TSVs 128, the dielectric layer 130, and the isolating liner 129 before the next step. For example, the top surfaces 140a of the TDVs 140 and the top surface 130a of the dielectric layer 130 may be substantially leveled (e.g., coplanar) with the top surface 129a of the isolating liner 129 and the exposed surfaces 128a of the TSVs 128.

Figure 1D:
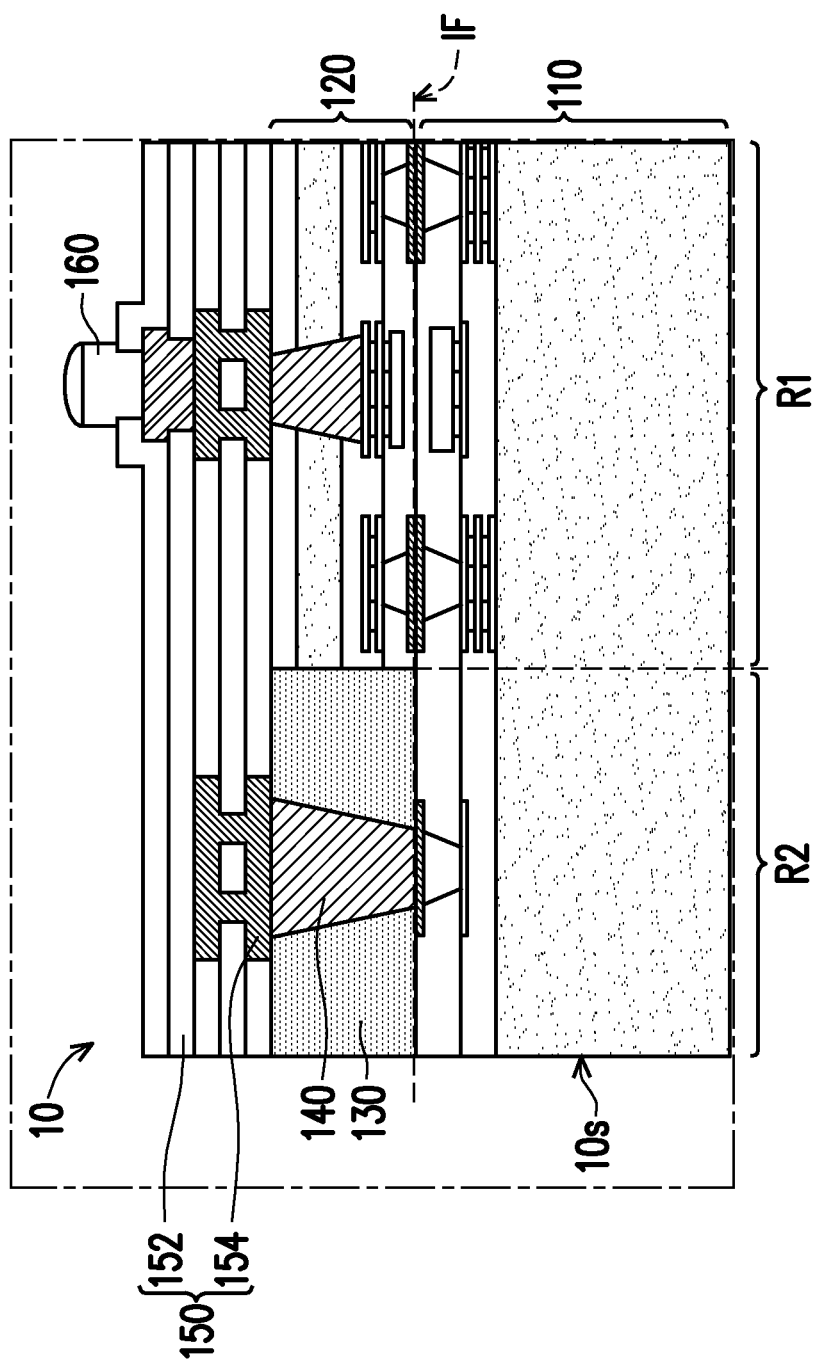

Referring to FIG. 1D and with reference to FIG. 1C, a redistribution structure 150 may be formed on the dielectric layer 130, the TDVs 140, the isolating liner 129, and the TSVs 128. For example, the redistribution structure 150 includes at least one patterned dielectric layer 152 and at least one patterned conductive layer 154 embedded in the patterned dielectric layer 152. The patterned conductive layer 154 including conductive lines, conductive pads, and conductive vias may be referred to as the redistribution layer or the redistribution lines. For example, the patterned conductive layer 154 is physically and electrically coupled to the TDVs 140 and the TSVs 128. The material of the patterned dielectric layer 152 may include silicon oxide, silicon nitride, low-k dielectrics, combinations of these, and/or the like. In some embodiments, the material of the patterned dielectric layer 152 includes polybenzoxazole (PBO), polyimide (PI), benzocyclobutene (BCB), or the like. The material of the patterned conductive layer 154 may include seed material, a metal (e.g., copper, titanium, tungsten, aluminum, alloy), and/or the like.

In some embodiments, a plurality of conductive terminals 160 may be formed on the redistribution structure 150 to form a die structure 10. In some embodiments, the patterned conductive layer 154 includes aluminum pads, and the conductive terminals 160 land on the aluminum pads. Other suitable conductive materials (e.g., copper) may be used to for the landing pads of the patterned conductive layer 154. The conductive terminals 160 may include a conductive material such as solder, copper, aluminum, gold, nickel, silver, palladium, tin, the like, or a combination thereof. The respective conductive terminal 160 may include a pillar portion connected to the patterned conductive layer 154, and a cap portion (e.g., a solder cap) formed on the pillar portion. For example, the conductive terminals 160 may be or may include micro-bumps, controlled collapse chip connection (C4) bumps, metal pillars, solder balls, ball grid array (BGA) connectors, electroless nickel-electroless palladium-immersion gold (ENEPIG) formed bumps, or the like. It is noted that the shape of the conductive terminal 160 is provided for illustrative purposes and may have various cross section depending on the design requirements. In some embodiments, a singulation process is optionally performed to cut off the redistribution structure 150, the dielectric layer 130 underlying the redistribution structure 150, and the first die 110 underlying the dielectric layer 130 to render a coterminous sidewall 10s of the die structure 10. Alternatively, the singulation is omitted.

It is understood that warpage may occur due to mismatch of the coefficients of thermal expansion (CTE) between materials, application of heat, temperature fluctuations, and/or the like, and the warpage may adversely impact the electrical performance of the devices/circuits formed in the die structure 10 and also affect subsequent processing and/or product reliability. It has been observed that by arranging the second dies and the TDVs in a proper manner, reduced warpage effect and level may be achieved. Some variations of embodiments are discussed. Throughout the various views and illustrative embodiments, the identical or similar numbers refer to the identical or similar elements.

Figure 2B:
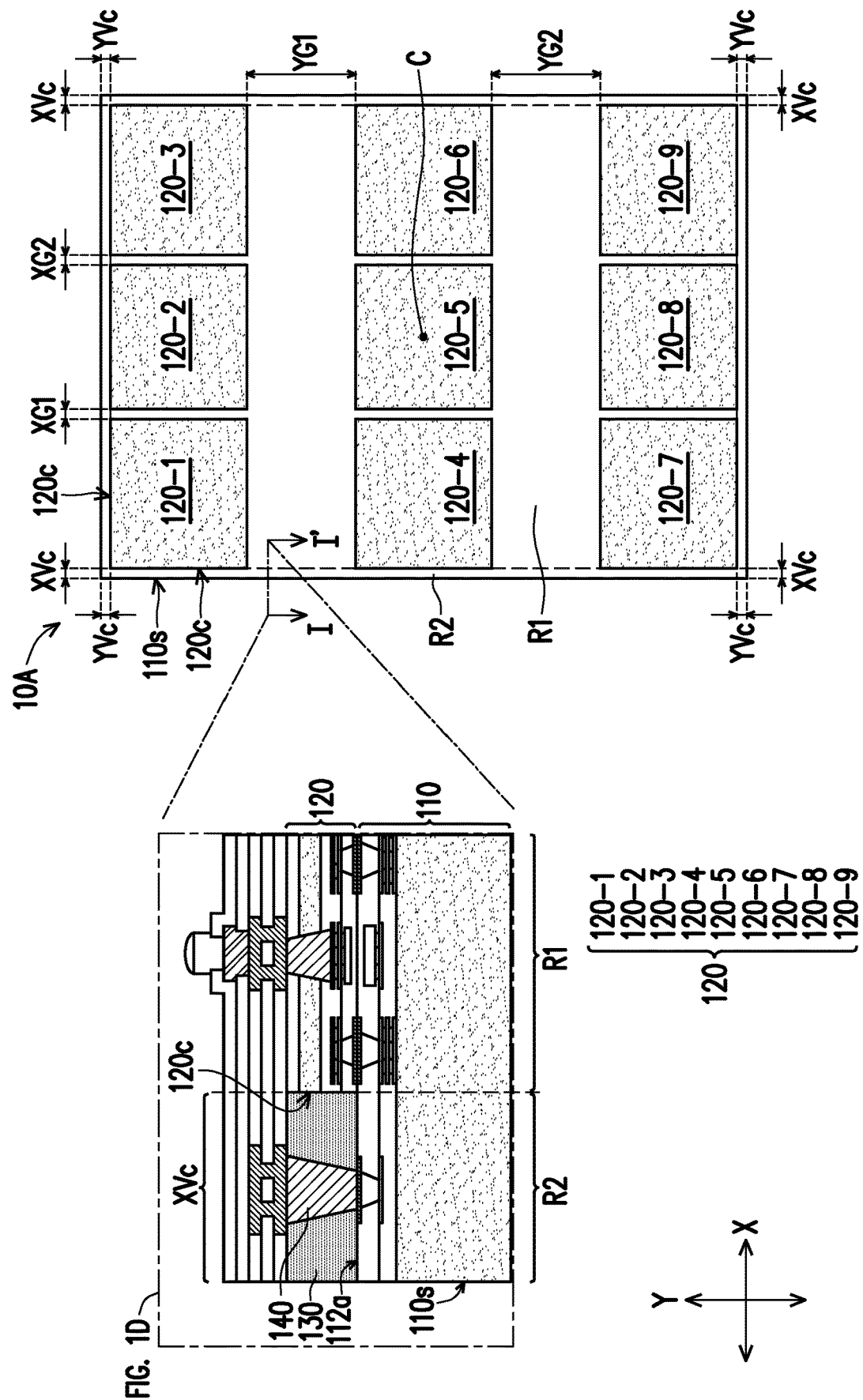

FIGS. 2A-2C are schematic top-down views showing a first type configuration of a semiconductor structure according to some embodiments. It is noted that the structure in dashed box in the following figures illustrates the magnified cross-sectional view taken along line I-I', for example, the structure shown in FIG. 1D. Moreover, the top plan views are simplified by omitting several elements for the sake of clarity. It has been observed that by arranging the second dies and the TDVs in the optimized manner, the time and effort of design may be reduced, thereby making the overall design effort more efficient.

Referring to FIG. 2A, the top plan view of the die structure 10A shows the relative position of the first region R1 and the second region R2 of the first die 110. The top-view shape of the first die 110 may be square, rectangle, or the like. In some embodiments, at least two second dies (not shown in the top plan view) are arranged side by side within the first region R1. In some embodiments, more than two of the second dies 120 may be distributed in an array in the first region R1. For example, the second dies 120 are arranged as an N×M array in the first region R1, where N and M are non-zero integers (greater than zero) and may (or may not) be equal to each other. The spacing rules of the die array will be described later in other embodiments. The top-view shape of the first region R1 may be the same as or similar to the top-view shape of the entire first die 110. In some embodiments, the center C of the first region R1 overlaps that of the active surface 112a of the first die 110.

The TDVs 140 of the die structure 10 may be disposed outside the first region R1. In some embodiments, the TDVs 140 are arranged along the sidewalls 110s of the first die 110 within the second region R2. In some embodiments, the second region R2 forms a ring shape along the perimeter of the first die 110 and encircles the first region R1. In some embodiments in which the first die 110 is of a rectangular shape, the second region R2 may be divided into four segments which include a pair of lateral segments extending along the X direction and a pair of longitudinal segments extending along the Y direction. For example, the width of the second region R2 is at the critical dimension (also referred to as the critical width herein). For example, the pair of lateral segments extending along the X direction has the critical width YVc, and the pair of longitudinal segments extending along the Y direction has the critical width XVc. The critical width (YVc and/or XVc) of the second region R2 may range from about 700 μm±10%. In some embodiments, the second region R2 has a substantially uniform width, and the critical width YVc and the critical width XVc are substantially equal to each other. In other embodiments, the critical width YVc and the critical width XVc are of different values. The width of the second region may be greater than the critical width and/or the width of the second region is non-uniform. It is noted that the critical width may vary with different designed demands of the die structure.

Referring to FIG. 2B, the top plan view of the die structure 10A shows the relative position of the second dies 120 and the first die 110. In the example configuration in FIG. 2B, the second dies (120-1~120-9) laid out as a 3×3 array having 3 rows and 3 columns is distributed over the first die 110. The shape of the respective second die 120 may be square or rectangle, and may have the same/similar size(s). Alternatively, the second dies are of various shapes and sizes. The number of the second dies 120, as shown in FIG. 2B, is provided for illustrative purposes only and is not meant to limit the scope of the embodiments discussed herein. It is worth noting that the dielectric layer 130 (not shown in the top plan view but labeled in the cross-sectional view) is formed in the gap between any two neighboring second dies 120.

In some embodiments, the center of the array of the second dies 120 is substantially aligned with the center C of the first region R1 (or the center of the active surface 112*a* of the first die 110). For example, the center C is located within the boundary defined by the second die (e.g., 120-5) located in the middle of the array. In some embodiments, the second dies 120 are evenly distributed in each row and each column across the array. In some embodiments, those second dies (e.g., 120-1~120-4 and 120-6~120-9) arranged at the periphery of the array may have at least one sidewall 120*c* aligned with the boundary of the first region R1. Those second dies (e.g., 120-1, 120-3, 120-7, and 120-9) located at the corners of the first region R1 may have two sidewall 120*c* substantially aligned with the corners of the boundary of the first region R1.

With continued reference to FIG. 2B, in the top plan view, the shortest distance between the sidewall 120*c* of the second die 120-1 and the sidewall 110*s* of the first die 110 is substantially equal to the critical width (YVc and/or XVc) of the second region R2. In the top plan view, the longitudinal gap YG1 is between the second dies at the uppermost row (e.g., 120-1, 120-2, and 120-3) and the second dies at the middle row (e.g., 120-4, 120-5, and 120-6), and the longitudinal gap YG2 is between the second dies at the middle row and the lowermost row (e.g., 120-7, 120-8, and 120-9). In some embodiments, the longitudinal gap YG1 is substantially equal to the longitudinal gap YG2. In other embodiments, the longitudinal gaps (YG1 and YG2) are of different values.

In the top plan view, the lateral gap XG1 is between the second dies at the left column (e.g., 120-1, 120-4, and 120-7) and the second dies at the middle column (e.g., 120-2, 120-5, and 120-8), and the lateral gap XG2 is between the second dies at the middle column and the right column (e.g., 120-3, 120-6, and 120-9). In some embodiments, the lateral gap XG1 is substantially equal to the lateral gap XG2. Alternatively, the lateral gaps (XG1 and XG2) may be different. In the example configuration in FIG. 2B, the respective lateral gap (XG1, XG2) is less than the respective longitudinal gap (YG1, YG2). In certain embodiments, the respective lateral gap (XG1, XG2) is about 1000 µm, and the respective longitudinal gap (YG1, YG2) is about 4650 µm. It is appreciated that the lateral and longitudinal gaps may vary depending on the size and the number of the second dies.

Referring to FIG. 2C, the die structure 10B includes the second dies 120 arranged in a 3×3 array, where the array may be centered in the first region R1 of the first die 110. The arrangement of the second dies 120 in FIG. 2C is similar to that of the example configuration illustrated in FIG. 2B, and the difference therebetween includes that each of the second dies 120 in the array is spaced apart from the adjacent one by the same (or similar) distance. That is, the second dies 120 may be spaced substantially equidistant from one another. For example, the lateral gaps (XG1 and XG2) and the longitudinal gaps (YG1 and YG2) are substantially equal to one another. In certain embodiments, the lateral and longitudinal gaps are about 1000 µm. Depending on the number and the size of the second dies 120, the distance between adjacent two dies may be at the critical gap. In some embodiments, those second dies (e.g., 120-1, 120-3, 120-7, and 120-9) located at the corners of the array may have only one sidewall 120*c* substantially aligned with the boundary of the first region R1. Those second dies (e.g., 120-1, 120-2, and 120-3) arranged at the uppermost row of the array and those second dies (e.g., 120-7, 120-8, and 120-9) arranged at the lowermost row of the array are distanced from the boundary of the first region R1. In the example configuration in FIG. 2C, the blank area RB is located between those second dies at the uppermost row (e.g., 120-1, 120-2, and 120-3) and the upper boundary of the first region R1 and the other blank area RB is located between those second dies at the lowermost row (e.g., 120-7, 120-8, and 120-9) and the lower boundary of the first region R1. Other arrangements are within the scope of various embodiments.

Figure 3A:
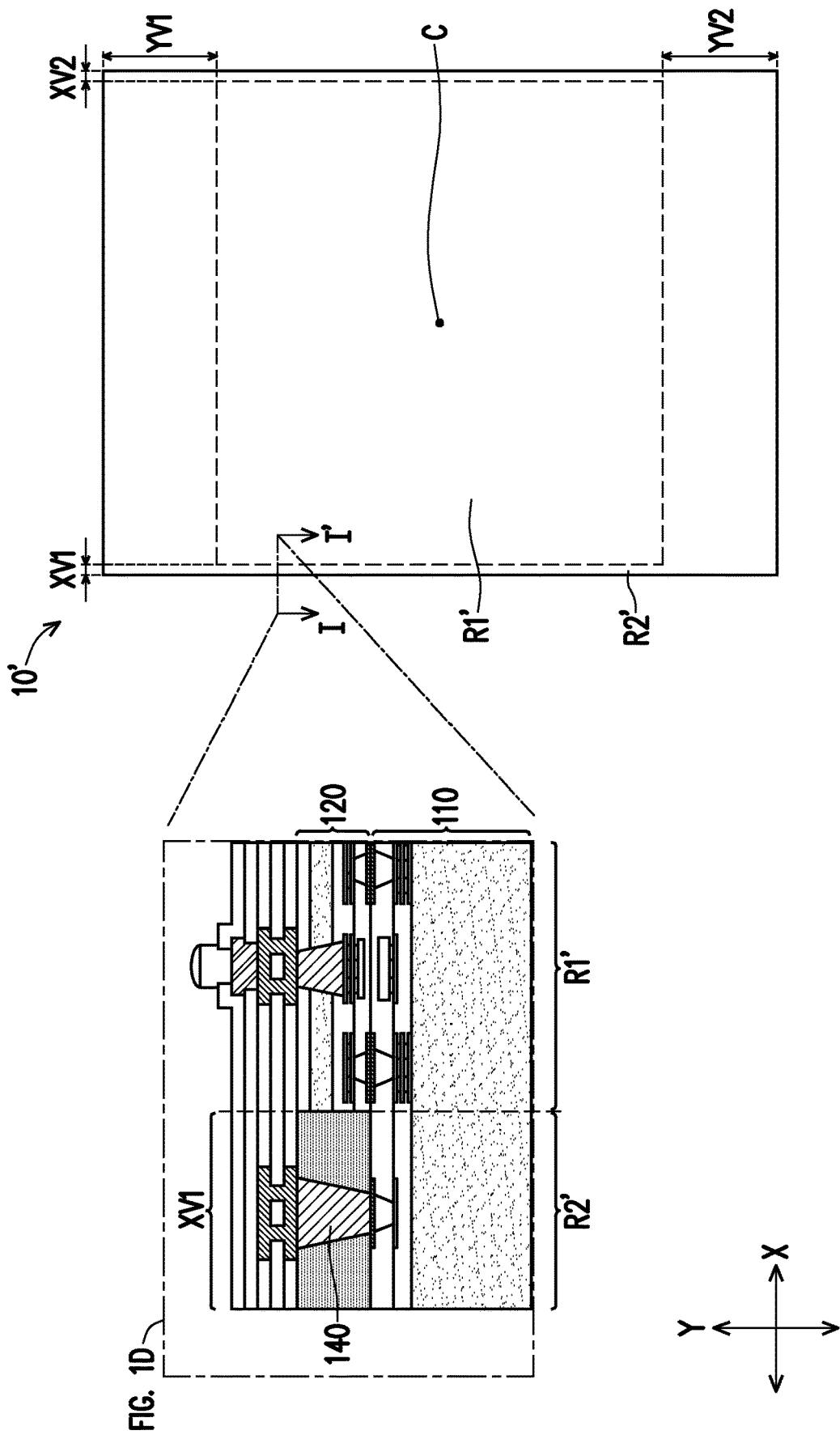
FIGS. 3A-3B are schematic top-down views showing a second type configuration of a semiconductor structure according to some embodiments.
Figure 3B:
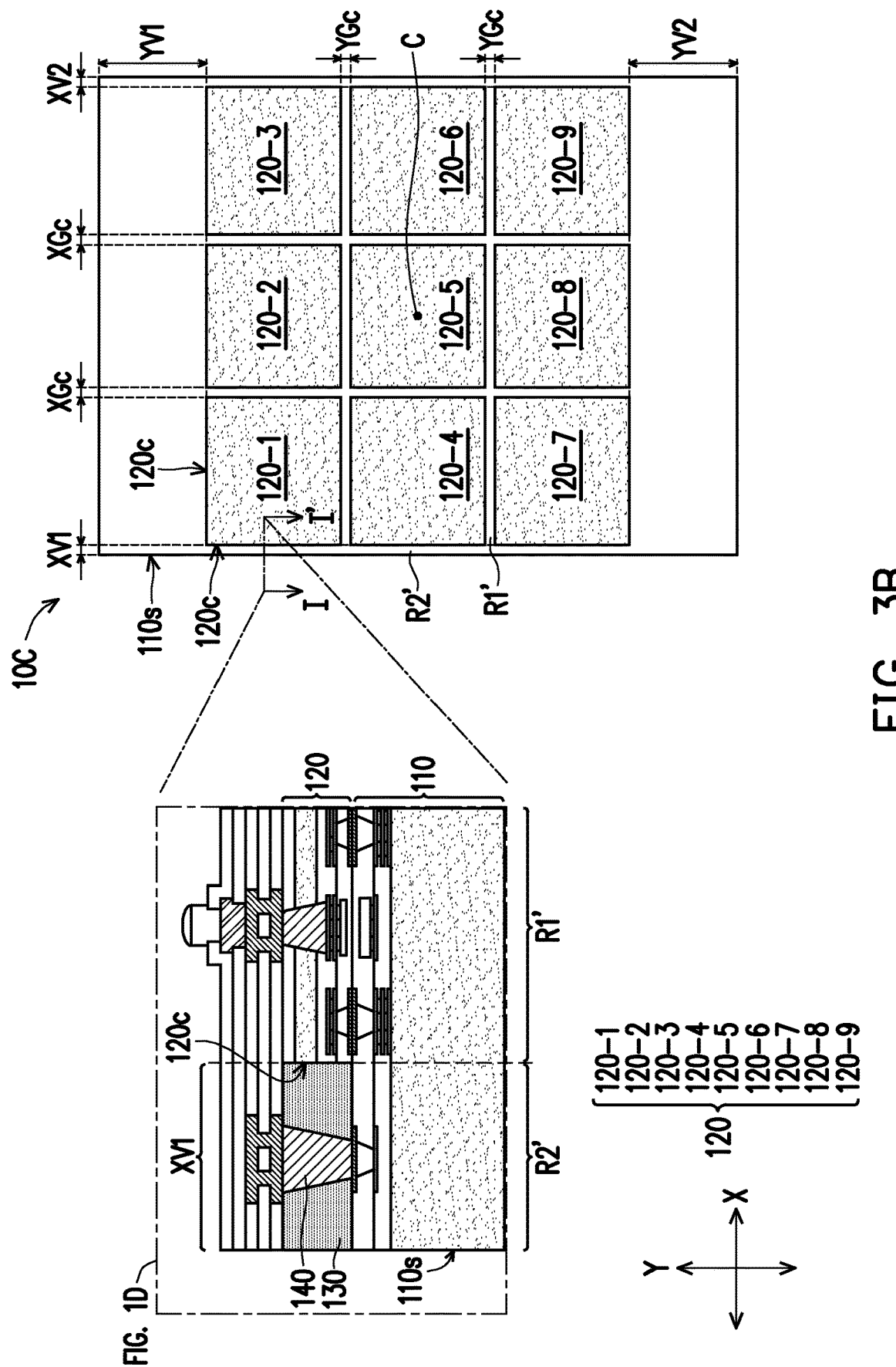

FIGS. 3A-3B are schematic top-down views showing a second type configuration of a semiconductor structure according to some embodiments. It is noted that the structure in dashed box in the following figures illustrates the magnified cross-sectional view taken along line I-I' and may be similar to the structure shown in FIG. 1D. Moreover, the top plan views are simplified by omitting several elements for the sake of clarity.

Referring to FIG. 3A and with reference to FIG. 2A, the top plan view of the die structure 10' showing the relative position of the first region R1' and the second region R2' may be similar to the top plan view of the die structure 10A in FIG. 2A. The difference therebetween includes that the second dies (not individually shown in the top plan view) in the first region R1' are arranged in the more compact fashion, thereby leaving a greater area for the arrangement of TDVs 140 in the first region R1'. For example, more than one of the second dies 120 is arranged within the first region R1'. Those second dies 120 may be spaced closer together in the first region R1' and farther apart in the edge region of the first die 110. In some embodiments, a plurality of the second dies 120 may be arranged as the N×M array inside the first region R1', where N and M are non-zero integers (greater than zero) and may (or may not) be equal to each other. In some embodiments, the center C of the first region R1' is substantially aligned with the center of the array or may be located within the area defined by the second die positioned at the center.

In some embodiments, the width of the second region R2' is substantially greater than the critical width. For example, the lateral segments extending along the X direction have the longitudinal widths (YV1 and YV2), where the longitudinal width YV1 may (or may not) be substantially equal to the longitudinal width YV2. The longitudinal segments extending along the Y direction may have the lateral widths (XV1 and XV2), where the lateral width XV1 may (or may not) be substantially equal to the lateral width XV2. In some embodiments, the lateral widths (XV1 and XV2) are substantially less than the longitudinal widths (YV1 and YV2). In some embodiments where the top-view shapes of the first die 110 and the array of the second dies 120 are of a square shape, the lateral widths and the longitudinal widths may be substantially the same. It is appreciated that the lateral and longitudinal widths of the second region R2' may vary with different designed demands of the die structure.

Referring to FIG. 3B, the top plan view of the die structure 10C shows the relative position of the second dies 120 and the first die 110. In the example configuration in FIG. 3B, the second dies (120-1~120-9) laid out as the 3×3 array having 3 rows and 3 columns are distributed over the first die 110. The number and the size of the second dies 120 shown in FIG. 3B are provided for illustrative purposes only and are not meant to limit the scope of the embodiments discussed herein. In some embodiments, the center of the array of the second dies 120 is substantially aligned with the center C of the first region R1. In some embodiments, the center C may be located within the boundary defined by the second die (e.g., 120-5) located at the center of the array. In some embodiments, the second dies 120 are evenly distributed in each row and each column across the array. In some embodiments, those second dies (e.g., 120-1~120-4 and 120-6~120-9) arranged along the periphery of the array may have at least one sidewall 120c aligned with the boundary of the first region R1'. For example, the respective second die (e.g., 120-1, 120-3, 120-7, and 120-9) located at the corner of the first region R1' may have two sidewall 120c substantially aligned with the boundary of the first region R1'.

With continued reference to FIG. 3B, the second dies 120 in the first region R1' may be substantially evenly spaced apart from one another. In some embodiments, the second dies 120 are distanced from one another by a critical gap. It is understood that the dielectric layer 130 is formed in the gap to laterally cover each second die 120. If the shortest lateral distance between two adjacent dies is less than the critical gap, the dielectric layer will not be able to be formed in the gap between the neighboring second dies 120. For example, in the top plan view, a shortest lateral distance between the sidewalls 120c of the second dies (e.g., 120-1 and 120-2) that are disposed side by side along the X direction is the critical gap XGc. Similarly, in the top plan view, a shortest longitudinal distance between the sidewalls 120c of the second dies (e.g., 120-1 and 120-4) that are disposed side by side along the Y direction is the critical gap YGc. In some embodiments, the critical gaps (XGc and YGc) are substantially equal to each other. In some embodiments, in the top plan view, the lateral width (XV1 or XV2) of the second region R2' is greater than the critical gap XGc. The longitudinal width (YV1 or YV2) of the second region R2' may also be greater than the critical gap YGc, in accordance with some embodiments. The critical gap (XGc and/or YGc) may range from about 70 μm±10%. It should be noted that the critical gap may vary with different designed demands of the die structure.

With continued reference to FIG. 3B and also referring to FIG. 2B, in these embodiments, it has been observed that the proper arrangement of the second dies 120 may reduce the warpage of the die structure and the stress on the bonding interface. Based on the simulation results, the warpage of the die structure 10A shown in FIG. 2B may be reduced to about 9%, compared with the warpage of the die structure 10C shown in FIG. 3B.

Figure 4A:
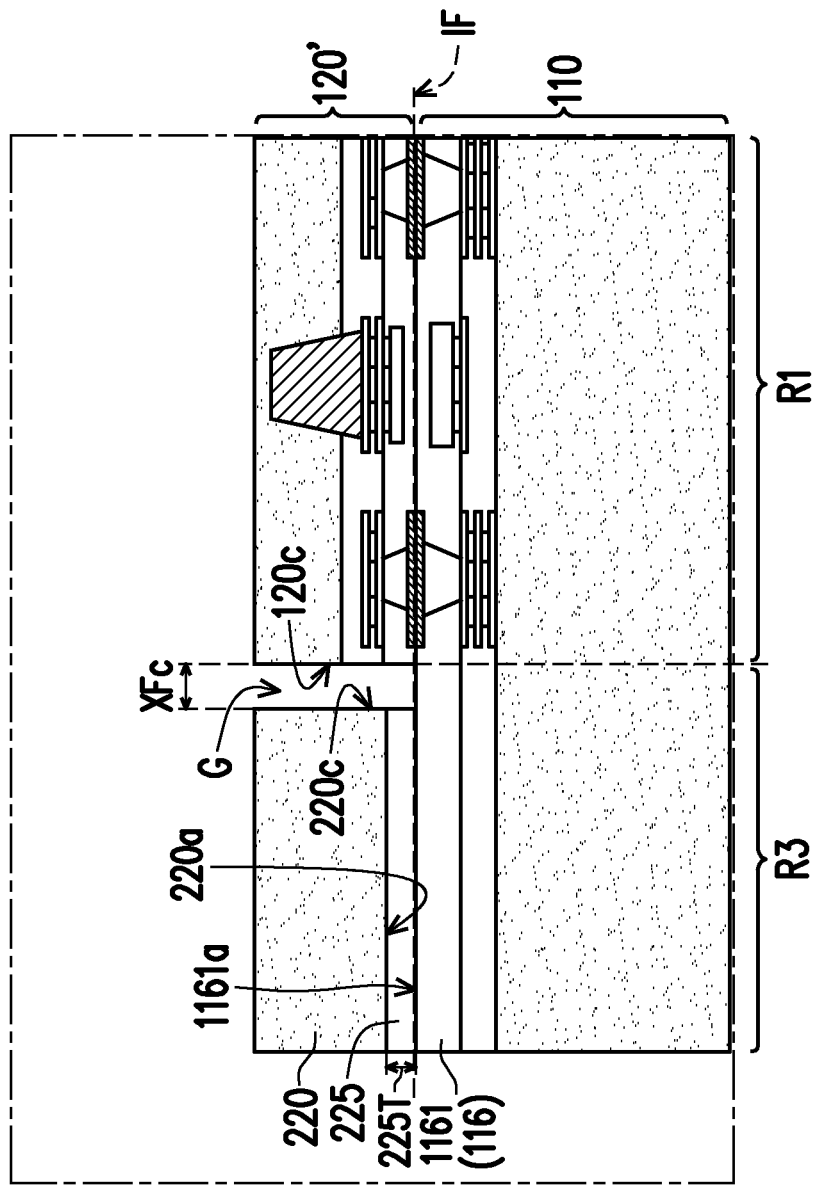
FIGS. 4A-4C are schematic and partial cross-sectional views showing various stages in a manufacturing method of a semiconductor structure according to some embodiments.
Figure 4B:
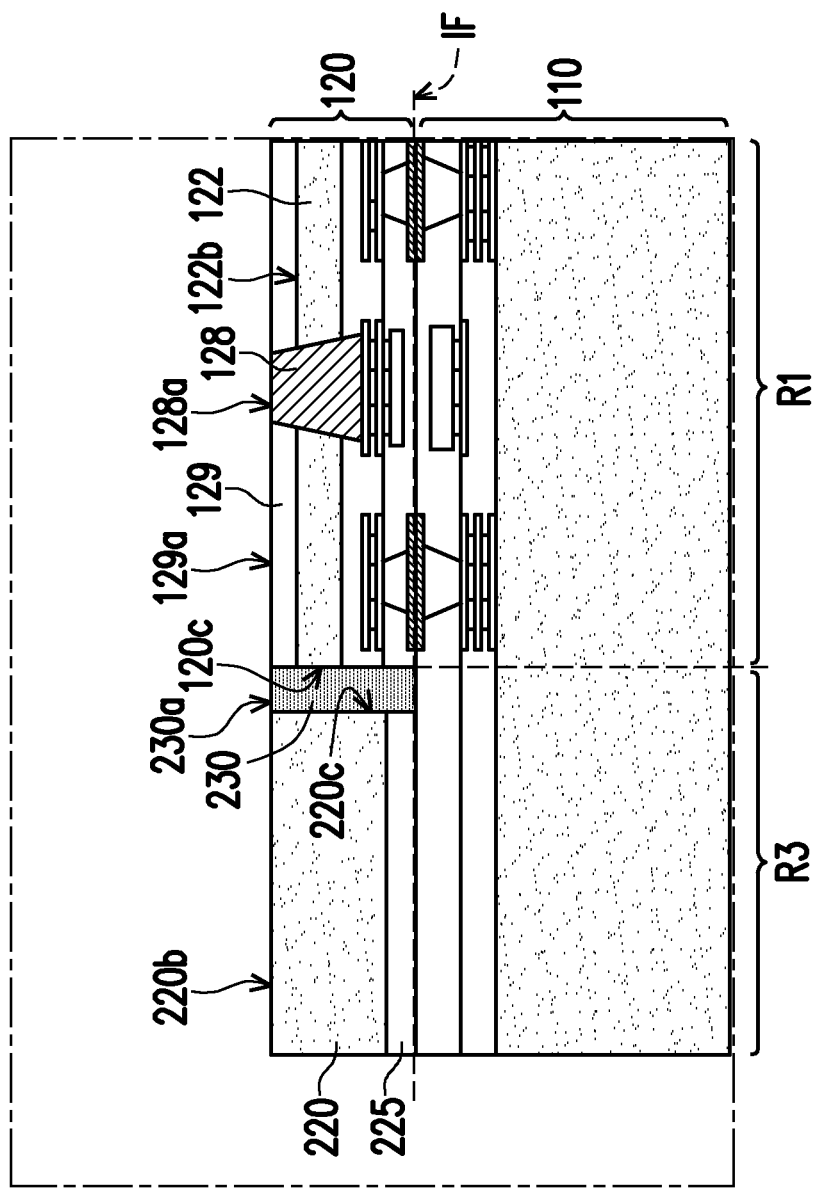
Figure 4C:
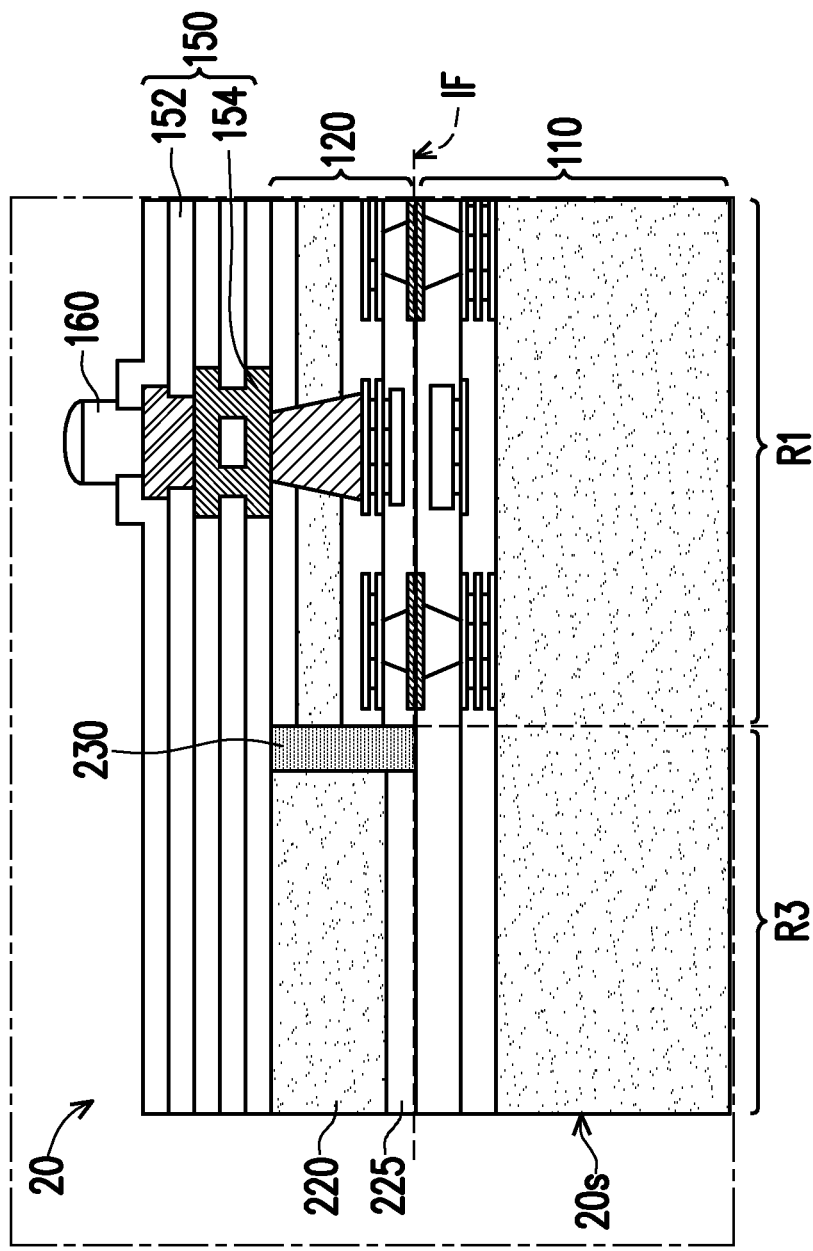

FIGS. 4A-4C are schematic and partial cross-sectional views showing various stages in a manufacturing method of a semiconductor structure according to some embodiments. Unless specified otherwise, the materials and the formation methods of the components in these embodiments are essentially the same as the like components, which are denoted by like reference numerals in the embodiments shown in FIGS. 1A-1D. The details regarding the materials of the components may thus be found in the discussion of the embodiments shown in FIGS. 1A-1D.

Referring to FIG. 4A, at least one second die 120' may be bonded to the first die 110 and positioned in the first region R1. The bonding process may be similar to the process described in FIG. 1A, so the detailed descriptions are not repeated for brevity. In some embodiments, at least one dummy die 220 disposed next to the second die 120' is bonded to the first die 110 and located within the third region R3. For example, the third region R3 surrounds the first region R1. It should be noted that a single dummy die 220 illustrated herein is merely an example, and the number and the size of the dummy die 220 construe no limitation in the disclosure. The dummy die 220 may be provided with a bonding dielectric layer 225 to facilitate bonding. For example, the first surface 220a of the dummy die 220 is bonded to the first bonding dielectric layer 1161 of the first die 110 through the bonding dielectric layer 225. In some embodiments, the bonding process of the dummy die 220 and the bonding process of the second die 120' are performed simultaneously. Alternatively, the bonding process of the second die 120' is performed before (or after) bonding the dummy die 220 to the first die 110.

In some embodiments, the dummy die 220 is spatially separated from the second die 120' by a gap G. In some embodiments, the gap G is at a critical width XFc measured between an inner sidewall 220c of the dummy die 220 and the sidewall 120c of the second die 120'. The critical width XFc may range from about 70 μm±10%. In some embodiments, the dummy die 220 does not perform an electrical function and has no active or passive devices formed therein. For example, the dummy die 220 may be deployed to supply thermal pathway for the resulting die structure to spread the heat over a larger area. The dummy die 220 may be or may include a substrate that is formed from a material selected from the candidate materials of the semiconductor substrate of the first die 110 (or the second die 120'). In some embodiments, the dummy die 220 includes any suitable substrate material with high thermal conductivity. For example, the substrate material of the dummy die 220 includes a thermal conductivity of about 1.5 W/m-K or greater than 1.5 W/m-K.

In some embodiments, the bonding dielectric layer 225 is formed from a material that is used to form dielectric-to-dielectric bonds with the first die 110. For example, the bonding dielectric layer 225 is formed from an oxide (e.g., silicon oxide), and may be formed at the first surface 220a using CVD, PVD, ALD, a spin-on coating process, a combination thereof, or the like. In some embodiments, the bonding dielectric layer 225 has a thickness 225T ranging from about 0.8 μm to about 5.2 μm. The surface area of the bonding dielectric layer 225 may be substantially equal to that of the first surface 220a of the dummy die 220. The surface area of the bonding dielectric layer 225 may be less than the surface area of the top surface 1161a of the first bonding dielectric layer 1161 in the third region R3. In other embodiments, conductive bonding features (not shown) may be embedded in the bonding dielectric layer 225 and may be bonded to bonding features (not shown) of the first die 110 located in the third region R3, where dielectric-to-dielectric bonds and metal-to-metal bonds may be formed at the bonding interface IF in the third region R3.

Referring to FIG. 4B and with reference to FIG. 4A, the TSVs 128 may be accessibly revealed to form the second die 120, and a dielectric layer 230 may be formed in the gap G and extends along the inner sidewall 220c of the dummy die 220 and the sidewall 120c of the second die 120. For example, a dielectric material layer is initially formed on the first die 110 to cover the dummy die 220 and the second die 120'. In some embodiments, a plurality of the second dies 120' are disposed side by side in an array within the first region R1 of the first die 110, and the gap between neighboring second dies 120' may be filled by the dielectric material layer. The dielectric material layer may be similar to the material of the dielectric layer 130 described in FIG. 1B and may also be referred to as "gap fill oxide". The planarization process may be optionally performed until the TSVs 128 are revealed. In some embodiments, the second semiconductor substrate 122 is slightly etched, so that a portion of the respective TSV 128 is protruded from the rear surface 122b. The isolating liner 129 is optionally formed on the rear surface 122b of the second semiconductor substrate 122 to laterally cover the portion of the TSV 128 that is protruded from the rear surface 122b. For example, the top surface 230a of the dielectric layer 230 may be substantially leveled (e.g., coplanar) with the top surface 129a of the isolating liner 129, the exposed surface 128a of the respective TSV 128, and the second surface 220b of the dummy die 220.

Referring to FIG. 4C, the redistribution structure 150 including the patterned dielectric layer 152 and the patterned conductive layer 154 may be formed on the dummy die 220, the dielectric layer 230, the isolating liner 129, and the TSVs 128. For example, the patterned dielectric layer 152 is deposited on the second surface 220b of the dummy die 220, the top surface 230a of the dielectric layer 230, the top surface 129a of the isolating liner 129, and the exposed surface 128a of the respective TSV 128. The bottommost portion of the patterned conductive layer 154 may pass through the patterned dielectric layer 152 to be physically and electrically connected to the exposed surface 128a of the respective TSV 128. Subsequently, the conductive terminals 160 may be formed on the redistribution structure 150 to form a die structure 20. The materials and the formation of the redistribution structure 150 and the conductive terminals 160 may be similar to those of the redistribution structure 150 and the conductive terminals 160 described in FIG. 1D, so the details thereof are omitted for the sake of brevity. In some embodiments, a singulation process is performed to cut off the redistribution structure 150, the dummy die 230 underlying the redistribution structure 150, and the first die 110 underlying the dummy die 230 so as to render a coterminous sidewall 20s of the die structure 20. Alternatively, the singulation is omitted.

As mentioned in the preceding paragraphs, it has been observed that by arranging the second dies 120 in a proper manner, reduced warpage effect and level may be achieved. Moreover, with the dummy die(s) disposed next to the array of the second dies 120, the warpage may be balanced and the thermal performance may be improved. Some variations of embodiments are discussed. In what follows, like reference numerals refer to like elements.

Figure 5A:
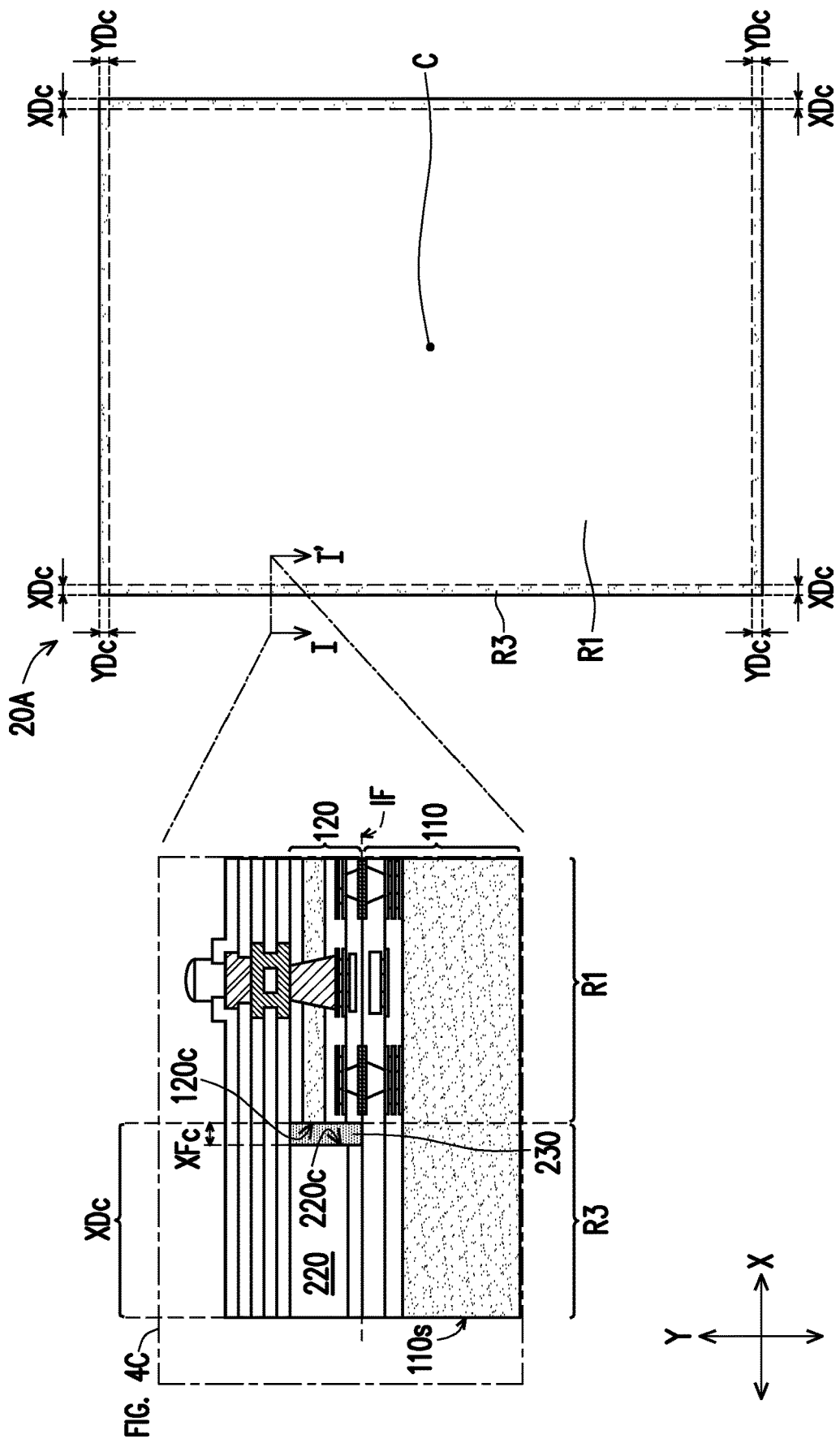
FIGS. 5A-5C are schematic top-down views showing a third type configuration of a semiconductor structure according to some embodiments.
Figure 5B:
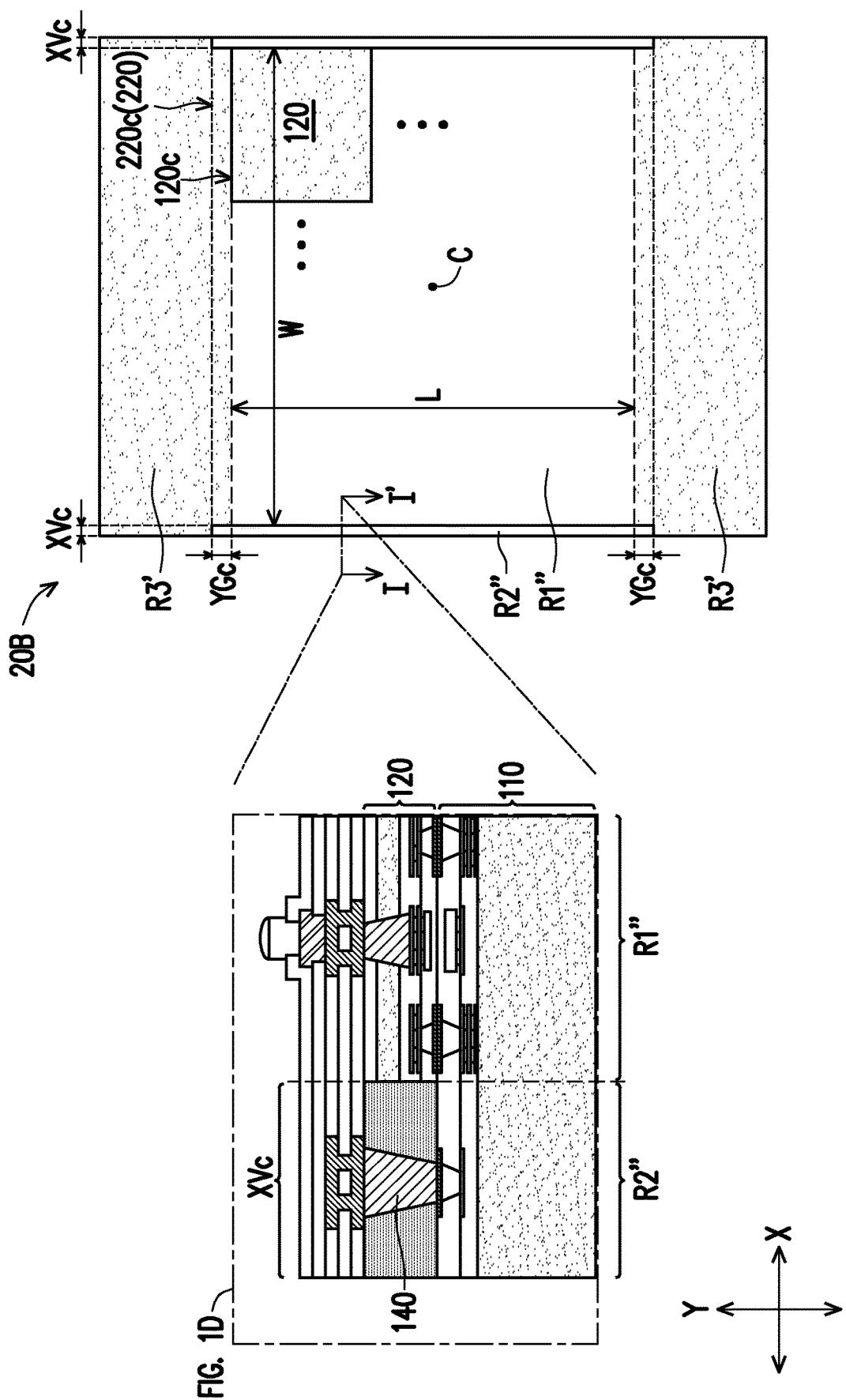
Figure 5C:
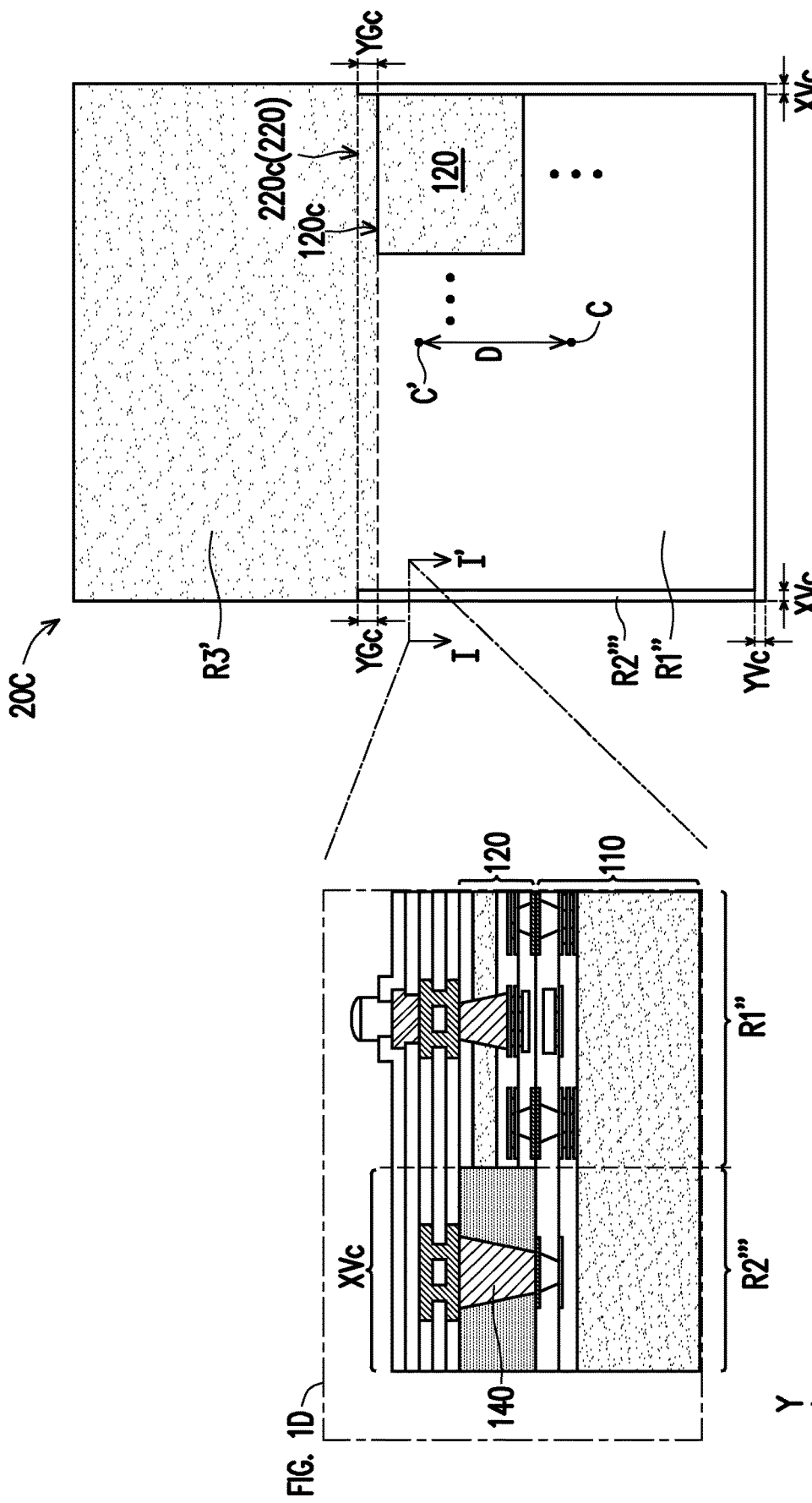

FIGS. 5A-5C are schematic top-down views showing a third type configuration of a semiconductor structure according to some embodiments. It is noted that the structure in dashed box in the following figures illustrates the magnified cross-sectional view taken along line I-I', for example, the structure shown in FIG. 4C. Moreover, the top plan views are simplified by omitting several elements for the sake of clarity. The die structure is provided in accordance with various embodiments in order to improve thermal performance by providing additional heat dissipation paths through the dummy die(s).

Referring to FIG. 5A, the top plan view of the die structure 20A shows the relative position of the first region R1 and the third region R3 of the first die 110. Compared to the die structure 10A shown in FIG. 2A, the second region R2 configured to accommodate the TDVs is replaced with the third region R3. In some embodiments, the second region R2 is omitted and the die structure 20A is free of the TDVs. For example, more than one second die (not individually shown in the top plan view but labeled in the cross-sectional view) is arranged in the first region R1, and at least one dummy die 220 is arranged in the third region R3. For example, the arrangement of the second dies 120 in the first region R1 is similar to any arrangement described in the preceding paragraphs (e.g., FIGS. 2B-2C and FIG. 3B). Although any number and configuration of the second dies 120 may be employed to realize the desired electrical specifications of the die structure 20A.

In some embodiments, at least one dummy die 220 shaped as a ring is placed in the third region R3. In some embodiments, a plurality of the dummy dies 220 are discontinuously arranged along the edges of the first die 110, where the shape of the respective dummy dies 220 may be or may include triangular, rectangular, square, hexagonal, circular, oval, or another suitable geometric shape. Alternatively, the dummy die 220 is of an L-shape or may include multiple strips. Any number and configuration of the dummy die(s) 220 may be employed to realize the desired thermal specifications of the die structure 20A. The size of the dummy die 220 may be controlled to ensure that the dielectric layer 230 formed between the sidewalls (120c and 220c) of the second die 120 and the dummy die 220 has the critical width XFc.

With continued reference to FIG. 5A, in the top plan view, the third region R3 may form a ring shape along the perimeter of the first die 110 and encircling the first region R1. In some embodiments in which the first die 110 is of a rectangular shape, the third region R3 is divided into four segments which include a pair of lateral segments extending along the X direction and a pair of longitudinal segments extending along the Y direction. In some embodiments, the width of the third region R3 is at the critical dimension (also referred to as the critical width herein). For example, the pair of lateral segments extending along the X direction has the critical width YDc, and the pair of longitudinal segments extending along the Y direction has the critical width XDc. The critical width (YDc and/or XDc) of the third region R3 may range from about 700 µm±10%. In some embodiments, the third region R3 has a substantially uniform width, and the critical widths (YDc and XDc) are substantially equal to each other. It is noted that the critical widths may vary with different designed demands of the die structure. In other embodiments, the width of the third region is greater than the critical width and/or the width of the second region is non-uniform.

Referring to FIG. 5B, the die structure 20B includes the dummy dies 220 disposed in the third regions R3' and the TDVs 140 disposed in the second regions R2". For example, the top plan view of the die structure 20B shows the relative position of the first region R1", the second region R2", and the third region R3'. In the example configuration in the top plan view of FIG. 5B, the center C of the first region R1" is substantially aligned with the center of the first die 110. The second regions R2" may be disposed at two opposing sides of the first region R1" and may extend along the Y direction, while the third regions R3' may be disposed at the other two opposing sides of the first region R1" and may extend along the X direction. The first region R1" includes a length L in the Y direction and a width W in the X direction. In some embodiments, in the top plan view, the length L of the first region R1" is less than the length of the respective second region R2", and the width W of the first region R1" is less than the maximum width of the respective third region R3'. The length of the respective second region R2" may be approximately equal to (or greater than) the sum of the length L of the first region R1" and twice the critical gap YGc. The maximum width of the respective third region R3' may be approximately equal to (or greater than) the sum of the width W of the first region R1" and twice the critical width XVc.

In some embodiments in which the sidewalls 120c of second dies 120 are at the upper (or lower) boundary of the first region R1" and the sidewalls 220c of the dummy dies 220 are the boundary of the third region R3' in proximity to the first region R1", the sidewalls 120c of second dies 120 and the sidewalls 220 of the dummy dies 220 are distanced by the critical gap YGc. In this manner, the dielectric layer is able to be formed between the second dies 120 and the dummy dies 220.

Referring to FIG. 5C, the die structure 20C including the first region R1", the second region R2''', and the third region R3' is similar to the die structure 20B shown in FIG. 5B. The center C of the first region R1" of the die structure 20C is misaligned with the center C of the active surface of the first die 110 by a distance D, where the distance D is non-zero. The value of the distance D may vary with different designed demands of the die structure. In some embodiments, the second region R2''' is of a U shape and connects three sides of the first region R1". The second region R2''' may have the critical width (YVc and/or XVc). Alternatively, the width of the second region R2''' is greater than the critical width. The sidewalls 220c of the dummy dies 220 disposed in the third region R3' are spaced apart from the sidewalls 120c of the second dies 120 in the first region R1" by the critical gap YGc. Again, the arrangements described with respect to FIGS. 5A-5C are only examples. Other arrangements are within the scope of various embodiments.

FIG. 6 is a schematic cross-sectional view showing an application of a semiconductor structure according to some embodiments. Referring to FIG. 6, a semiconductor package 50 including a first component 52 and a second component 54 disposed over the first component 52 is provided. The first component 52 may be or may include a printed circuit board (PCB), a printed wiring board, an interposer, a package substrate, and/or other carrier that is capable of carrying integrated circuits. The second component 54 mounted on the first component 52 may be similar to any one of the die structures described in the preceding paragraphs. In some embodiments, more than one the die structures (e.g., any combination of the die structures described above) may be electrically coupled to the first component 52 through a plurality of terminals 54a. In some embodiments, the terminals 54a are the conductive terminals 160 described above, and a reflow process may be performed on the conductive terminals 160 to mount the die structure on the first component 52.

The die structure (e.g., 10, 10A, 10B, 10C, 20, 20A, 20B, and/or 20C) described above may be or may be a part of an Integrated-Fan-Out (InFO) package, a Chip-On-Wafer-On-Substrate (CoWoS) package, a Chip-On-Wafer (CoW) package, a system on a chip device, a system on integrated circuit devices, etc. For example, the second component 54 mounted on the first component 52 may be the InFO package including at least one die structure (e.g., any one or combination of the die structures described above) packaged therein. For example, the second component 54 includes the die structures separately and laterally encapsulated by a molding layer (not shown). The second component 54 may further include a fan-out redistribution structure (not shown) formed on the molding layer and the semiconductor structures, and the fan-out redistribution structure may be electrically coupled to the semiconductor structures through the conductive terminals 160. A plurality of external terminals 54a of the second component 54 may be formed on the fan-out redistribution structure to be electrically coupled to the first component 52 and the die structures. Other packaging techniques may be used to form the semiconductor package 50, which are not limited in the disclosure. The semiconductor package 50 may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

In accordance with some embodiments, a semiconductor structure includes a first die, a plurality of second dies disposed on and electrically coupled to the first die, a dielectric layer disposed on the first die and laterally covering each of the second dies, and a plurality of through dielectric vias disposed on and electrically coupled to the first die. The first die includes a first bonding dielectric layer and a plurality of first bonding features embedded in and substantially leveled with the first bonding dielectric layer. The second dies are arranged as an array in a first region of the first die, each of the second dies includes a second bonding dielectric layer and a second bonding feature embedded in and substantially leveled with the second bonding dielectric layer, where the second bonding dielectric layers are bonded to the first bonding dielectric layer, and the second bonding features are bonded to the first bonding features. The through dielectric vias are disposed on and electrically coupled to the first die, the through dielectric vias are laterally covered by the dielectric layer and arranged in a second region of the first die, where the second region is connected to the first region and arranged along a periphery of the first die.

In accordance with some embodiments, a semiconductor structure includes a first die, a plurality of second dies arranged as an array and disposed on the first die, at least one dummy die disposed next to the array of the second dies, and a dielectric layer disposed on the first die and laterally covering the at least one dummy die and each of the second dies. The first die includes a first semiconductor substrate, a first interconnect structure disposed over the first semiconductor substrate, and a first bonding structure disposed over the first interconnect structure and electrically coupled to the first semiconductor substrate through the first interconnect structure. Each of the second dies includes a second semiconductor substrate, a second interconnect structure disposed below the second semiconductor substrate, a second bonding structure disposed below the second interconnect structure and bonded to the first bonding structure, a through substrate via penetrating through the second semiconductor substrate and extending into the second interconnect structure to be electrically coupled to the second interconnect structure. A bonding interface between the first bonding structure and the second bonding structure is substantially flat. The dummy die is bonded to the first bonding structure of the first die, and a sidewall of the at least one dummy die is substantially leveled with a sidewall of the first die.

In accordance with some embodiments, a manufacturing method of a semiconductor structure includes at least the following steps. A plurality of second dies is arranged in an array in a first region of a first die, where in a top plan view, a shortest distance between the array of the second dies and a sidewall of the first die is at least at a critical width, and adjacent ones of the second dies are at least spaced by a critical gap. The second dies is bonded to the first die, where dielectric-to dielectric bonds and metal-to-metal bonds are formed at a substantially flat bonding interface between the first die and each of the second dies. A dielectric layer is formed on the first die to laterally cover each of the second dies. A redistribution structure is formed on the dielectric layer and the second dies, where the redistribution structure is electrically coupled to the first die through the second dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first die comprising a first bonding dielectric layer and a plurality of first bonding features embedded in and substantially leveled with the first bonding dielectric layer;
a plurality of second dies disposed on and electrically coupled to the first die, the second dies being arranged as an array in a first region of the first die, each of the second dies comprising a second bonding dielectric layer and a second bonding feature embedded in and substantially leveled with the second bonding dielectric layer, wherein the second bonding dielectric layers are bonded to the first bonding dielectric layer, and the second bonding features are bonded to the first bonding features;
a dielectric layer disposed on the first die and laterally covering each of the second dies; and
a plurality of through dielectric vias disposed on and electrically coupled to the first die, the through dielectric vias being laterally covered by the dielectric layer and arranged in a second region of the first die, wherein the second region is connected to the first region and arranged along a periphery of the first die,
wherein a lateral dimension of the second region is at a critical width and is substantially less than a shortest lateral distance between two adjacent ones of the second dies.

2. The semiconductor structure of claim 1, wherein:
the lateral dimension of the second region is substantially equal to a shortest lateral distance between an outer sidewall of the dielectric layer and a sidewall of one of the two adjacent ones of the second dies that is closer to the outer sidewall of the dielectric layer, and
the outer sidewall of the dielectric layer is substantially leveled with a sidewall of the first die.

3. The semiconductor structure of claim 1, wherein a first sidewall and a second sidewall of one of the second dies located at a corner of the array is substantially aligned with a corner of a boundary of the first region.

4. The semiconductor structure of claim 3, wherein in a top plan view,
a shortest lateral distance between a third sidewall of the one of the second dies located at the corner of the array and a sidewall of adjacent one of the second dies is less than a shortest longitudinal distance between a fourth sidewall of the one of the second dies located at the corner of the array and a sidewall of adjacent another of the second dies.

5. The semiconductor structure of claim 1, wherein:
the second dies are spaced substantially equidistant from one another, and
a sidewall of one of the second dies located at a corner of the array is at a side of a boundary of the first region and another sidewall of the one of the second dies located at the corner of the array is distanced from an adjacent side of the boundary of the first region.

6. The semiconductor structure of claim 1, wherein a center of the array of the second dies is substantially aligned with a center of the first die in a top plan view.

7. The semiconductor structure of claim 1, wherein:
the second dies are spaced substantially equidistant from one another, and
adjacent ones of the second dies are spaced by a critical gap.

8. The semiconductor structure of claim 1, wherein:
the first die further comprises:
a first semiconductor substrate and a first interconnect structure disposed over the first semiconductor substrate, wherein the first bonding dielectric layer and the first bonding features are disposed over the first interconnect structure; and
each of the second dies further comprises:
a second semiconductor substrate and a second interconnect structure disposed below the second semiconductor substrate, wherein the second bonding dielectric layer and the second bonding features are disposed below the second interconnect structure.

9. The semiconductor structure of claim 1, further comprising:
at least one dummy die bonded to the first die and located in a third region that is connected to the first region and the second region, the at least one dummy die being laterally covered by the dielectric layer and disposed next to the array of the second dies, wherein the at least one dummy die and a closest one of the second dies are spaced by a critical gap.

10. A semiconductor structure, comprising:
a first die comprising:
a first semiconductor substrate and a first interconnect structure disposed over the first semiconductor substrate; and
a first bonding structure disposed over the first interconnect structure and electrically coupled to the first semiconductor substrate through the first interconnect structure;
a plurality of second dies arranged as an array and disposed on the first die, and each of the second dies comprising:
a second semiconductor substrate and a second interconnect structure disposed below the second semiconductor substrate;
a second bonding structure disposed below the second interconnect structure and bonded to the first bonding structure, wherein a bonding interface between the first bonding structure and the second bonding structure is substantially flat; and
a through substrate via penetrating through the second semiconductor substrate and extending into the second interconnect structure to be electrically coupled to the second interconnect structure;
at least one dummy die disposed next to the array of the second dies and bonded to the first bonding structure of the first die, a sidewall of the at least one dummy die being substantially leveled with a sidewall of the first die; and
a dielectric layer disposed on the first bonding structure of the first die and laterally covering the at least one dummy die and each of the second dies.

11. The semiconductor structure of claim 10, wherein:
the array of the second dies are disposed in a first region of the first die, and
the at least one dummy die is of a ring shape and disposed in a second region which encircles the first region.

12. The semiconductor structure of claim 11, wherein a lateral dimension of the second region is at a critical width, and the at least one dummy die and a closest one of the second dies are spaced by a critical gap.

13. The semiconductor structure of claim 10, further comprising:

a plurality of through dielectric vias penetrating through the dielectric layer and landing on pads of the first bonding structure of the first die, wherein:
  the array of the second dies are disposed in a first region of the first die,
  the through dielectric vias are distributed in second regions of the first die, wherein the second regions are located at two opposing sides of the first region, and
the at least one dummy die is disposed in a third region that is connected to the second regions and the first region.

14. The semiconductor structure of claim 10, further comprising:
a plurality of through dielectric vias penetrating through the dielectric layer and landing on pads of the first bonding structure of the first die, wherein:
  the array of the second dies are disposed in a first region of the first die,
  the through dielectric vias are distributed in a second region of the first die, wherein the second region is of a U shape and surrounds the first region, and
  the at least one dummy die is disposed in a third region that is connected to the second region and the first region.

15. The semiconductor structure of claim 14, wherein a center of the first region is misaligned with a center of a major surface of the first die by a non-zero distance.

16. A manufacturing method of a semiconductor structure, comprising:
arranging a plurality of second dies in an array in a first region of a first die, wherein in a top plan view, a shortest distance between the array of the second dies and a sidewall of the first die is shorter than a shortest spacing between adjacent ones of the second dies;
bonding the second dies to the first die, wherein dielectric-to dielectric bonds and metal-to-metal bonds are formed at a substantially flat bonding interface between the first die and each of the second dies;
forming a dielectric layer on the first die to laterally cover each of the second dies; and
forming a redistribution structure on the dielectric layer and the second dies, wherein the redistribution structure is electrically coupled to the first die through the second dies.

17. The manufacturing method of claim 16, further comprising:
forming a plurality of through dielectric vias in the dielectric layer to be connected to the first die in a second region, wherein the second region is at a periphery of the first die and surrounds the first region.

18. The manufacturing method of claim 16, further comprising:
attaching a dummy die to the first die in a second region before forming the dielectric layer, wherein the second region is at a periphery of the first die and surrounds the first region, and after the dielectric layer is formed, the dummy die is covered by the dielectric layer.

19. The manufacturing method of claim 16, further comprising:
attaching a dummy die to the first die in a second region; and
forming a plurality of through dielectric vias in the dielectric layer to be connected to the first die in a third region, wherein the second region is connected to the first region and the third region.

20. The semiconductor structure of claim 1, wherein the second dies are arranged along rows in the first region, adjacent ones of the second dies in the same row are laterally separated by a first lateral spacing, each row of the second dies are laterally spaced apart from an adjacent row of the second dies by a second lateral spacing, and the first lateral spacing is shorter than the second lateral spacing.

* * * * *